(12) United States Patent
Hänninen et al.

(10) Patent No.: US 11,309,676 B2
(45) Date of Patent: Apr. 19, 2022

(54) INTEGRATED MULTILAYER STRUCTURE AND A METHOD FOR MANUFACTURING A MULTILAYER STRUCTURE

(71) Applicant: Tactotek Oy, Oulunsalo (FI)

(72) Inventors: Ilpo Hänninen, Oulunsalo (FI); Jarmo Sääski, Oulunsalo (FI); Mikko Heikkinen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/872,428

(22) Filed: May 12, 2020

(65) Prior Publication Data

US 2021/0359481 A1 Nov. 18, 2021

(51) Int. Cl.
*H05K 1/18* (2006.01)
*H01R 43/20* (2006.01)
(Continued)

(52) U.S. Cl.
CPC ......... *H01R 43/205* (2013.01); *H01R 12/722* (2013.01); *H01R 12/724* (2013.01);
(Continued)

(58) Field of Classification Search
CPC . H05K 2201/1034; H05K 2201/10184; H05K 2201/10303; H05K 3/284; H05K 1/11; H05K 1/14; H05K 1/18; H05K 1/141–144; H05K 1/181–187; H05K 5/00; H05K 5/02; H01K 1/11; H01K 1/14; H01K 1/141; H01K 1/18;
(Continued)

(56) References Cited

U.S. PATENT DOCUMENTS 5,311,398 A * 5/1994 Schirmer ............ B60R 16/0239
174/548
5,657,203 A * 8/1997 Hirao .................. H01L 21/4842
257/E23.066
(Continued)

OTHER PUBLICATIONS

International Search Report issued by the European Patent Office acting as the International Searching Authority in relation to International Application No. PCT/FI2021/050329 dated Jul. 27, 2021 (4 pages).
(Continued)

*Primary Examiner* — Tuan T Dinh
(74) *Attorney, Agent, or Firm* — Robert P. Michal, Esq.; Carter, DeLuca & Farrell LLP

(57) ABSTRACT

An integrated multilayer structure includes a substrate film including an electrically insulating material; a circuit design including electrically conductive elements provided on the substrate film, the conductive elements defining a number of contact areas; a connector at the edge of the substrate film, the connector including a number of electrically conductive elongated contact elements, such as pins, connected to the contact areas of the conductive elements of the circuit design on the substrate film while further extending from the substrate film to couple to an external connecting element responsive to mating the external connecting element with the connector; and at least one plastic layer molded onto the substrate film so as to at least partially cover the circuit design and only partially cover the connector.

32 Claims, 9 Drawing Sheets

(51) Int. Cl.
*H01R 12/72* (2011.01)
*H01R 13/504* (2006.01)
*H01R 43/24* (2006.01)

(52) U.S. Cl.
CPC ........... *H01R 13/504* (2013.01); *H01R 43/24* (2013.01); *H05K 1/18* (2013.01); *H05K 2201/1034* (2013.01); *H05K 2201/10189* (2013.01); *H05K 2201/10303* (2013.01)

(58) Field of Classification Search
CPC .. H01K 1/181–187; H01R 12/722–724; H01R 12/504; H01R 43/204–205
USPC ........ 361/752–754, 760–764, 775–778, 803; 174/259–260, 825; 257/730, 787–790
See application file for complete search history.

(56) References Cited

U.S. PATENT DOCUMENTS

| | | | | |
|---|---|---|---|---|
| 5,689,137 A * | 11/1997 | Weber | ............... | B29C 45/14655 257/667 |
| 6,128,195 A * | 10/2000 | Weber | ................... | H05K 3/284 257/679 |
| 6,272,021 B1 * | 8/2001 | Nagamine | ............ | H05K 5/0065 361/736 |
| 6,445,592 B1 * | 9/2002 | Schirmer | ............ | B60R 16/0239 174/260 |
| 6,900,383 B2 * | 5/2005 | Babb | ...................... | H01L 23/552 174/394 |
| 7,004,780 B1 * | 2/2006 | Wang | ..................... | H01R 13/60 361/752 |
| 7,095,617 B1 * | 8/2006 | Ni | ........................ | H05K 5/0278 361/736 |
| 7,151,674 B2 * | 12/2006 | Sasaki | ................. | B60R 16/0239 361/752 |
| 7,407,390 B1 * | 8/2008 | Ni | ........................ | H01R 13/50 439/76.1 |
| 7,576,991 B2 * | 8/2009 | Naritomi | ................ | H05K 3/284 361/748 |
| 7,699,622 B2 * | 4/2010 | Sakamoto | ............ | H01R 12/716 439/76.1 |
| 7,703,991 B2 * | 4/2010 | Lu | ........................ | G02B 6/4292 385/88 |
| 7,813,134 B2 * | 10/2010 | Katsuro | ............. | H05K 7/20854 361/714 |
| 8,102,658 B2 * | 1/2012 | Hiew | .................... | G06F 1/1632 361/737 |
| 8,253,041 B2 * | 8/2012 | Chen | ................. | H01L 23/49861 361/813 |
| 8,449,205 B2 * | 5/2013 | Little | ....................... | G02B 6/32 385/93 |
| 9,293,870 B1 * | 3/2016 | Koczwara | ............ | H05K 5/0069 |
| 10,288,800 B1 | 5/2019 | Keranen et al. | | |
| 2004/0159455 A1 * | 8/2004 | Onizuka | ................ | H05K 7/026 174/50 |
| 2006/0012034 A1 * | 1/2006 | Kadoya | ............. | H05K 7/20872 257/712 |
| 2006/0171127 A1 * | 8/2006 | Kadoya | .................. | H05K 3/284 361/752 |
| 2007/0180264 A1 * | 8/2007 | Ni | ........................ | H05K 5/0269 713/186 |
| 2009/0073663 A1 | 3/2009 | Degenkolb et al. | | |
| 2009/0091894 A1 * | 4/2009 | Sakurai | ................. | H01L 23/552 361/737 |
| 2009/0190277 A1 * | 7/2009 | Hiew | ................... | H05K 5/0278 361/56 |
| 2014/0098505 A1 * | 4/2014 | Baker | .................... | H05K 3/284 361/764 |
| 2015/0062825 A1 * | 3/2015 | Ossimitz | ............. | H01L 23/4006 361/719 |
| 2020/0067377 A1 * | 2/2020 | Buckmueller | ......... | H02K 5/225 |

OTHER PUBLICATIONS

Written Opinion of the International Searching Authoirty issued by the European Patent Office acting as the International Searching Authority in relation to International Application No. PCT/FI2021/050329 dated Jul. 27, 2021 (7 pages).

* cited by examiner

600

640

700

740

1300

1400

INTEGRATED MULTILAYER STRUCTURE AND A METHOD FOR MANUFACTURING A MULTILAYER STRUCTURE

FIELD OF THE INVENTION

Generally the present invention relates to electronics, associated devices, structures and methods of manufacture. In particular, however not exclusively, the present invention concerns provision of a connecting arrangement for enabling external electrical connection to the internals of a functional structure containing at least one film layer and adjacent molded plastics layer integrated together.

BACKGROUND

There exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

The concept of injection molded structural electronics (IMSE) actually involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment.

When a multilayer structure, such as an IMSE structure, is loaded with various electronics, it may not always function or operate completely in isolation, i.e. autonomously. Instead, various power, data and/or control connections may have to be provided or are at least preferably provided thereto, which typically requires provision and configuration of electrical connectors and related wiring, or generally conductive elements, even though also wireless connections may be occasionally applicable as well.

In some use scenarios it may be feasible if not advantageous to provide a wired or generally contact-based electrical connection between the environment and the embedded electronics of a stacked, multilayer type, structure via a central portion of the structure and constituent elements thereof by, for example, providing one or more vias extending through the associated material layers such as one or more substrates included.

However, visual artifacts or generally visual effects arising from such connection arrangements may sometimes turn out problematic especially when, but not limited to situations wherein, the overall structure is highly transparent or at least translucent. The structure may be at least partially exposed visually to the environment in which cases one or more connecting features such as connectors thereof can easily remain perceivable with mere eyes, which is not often preferred in terms of at least aesthetic objectives set for the design.

In addition, different connection arrangements may occasionally consume considerable area or volume in the structure, which reduces the space available for other elements such as electronics components or generally circuit design that should be integrated in the structure as well. Accordingly, positioning of the remaining elements may become challenging in terms of space and sometimes also desired functionality considering, among others, e.g. optical or optoelectronic components whose optimal location may be rather limited in terms of related radiation emission or reception properties, or so-called optical path.

Still, many current connection methods used in multilayer structures suffer from different durability and reliability issues e.g. in the context of use scenarios where the structures and connection arrangements thereof are subjected to stress caused by external forces such as bending or torsion forces, while further limiting the configuration of the stacked overall design in terms of e.g. number of electrically active layers and additional layers such as molded layers.

SUMMARY

The objective of the present invention is to at least alleviate one or more of the above drawbacks associated with the existing solutions especially but not solely in the context of integral multilayer structures containing embedded electronics and related connectivity.

The objective is achieved with various embodiments of a multilayer structure and related method of manufacture in accordance with the present invention.

According to one embodiment of the present invention, an integrated multilayer structure comprises a substrate film of e.g., planar and/or flexible type, comprising electrically substantially insulating material, e.g., electrically substantially insulating thermoplastic material;

a circuit design comprising electrically conductive elements (106), optionally including traces, provided, such as printed or deposited, on the substrate film, said conductive elements defining a number of contact areas;

a connector at the edge of the substrate film, the connector comprising a number of electrically conductive elongated, optionally substantially rigid, contact elements, such as pins, connected to the contact areas of the conductive elements of the circuit design on the substrate film while further extending from the substrate film to couple to an external connecting element responsive to mating the external connecting element with the connector; and at least one plastic layer, optionally multiple plastic layers and further optionally at least one of which residing on each side of the substrate film, preferably of thermoplastic or thermoset electrically insulating material, molded onto the substrate film so as to at least partially cover the circuit design and only partially cover the connector, the covered portions including connection points of the contact elements with the contact areas and at least partially excluding the extended portions of the contact elements configured to couple to the external connecting element.

In some embodiments, a portion of the connector such as one or more contact elements thereof may have been provided physically through the substrate film, e.g. via at least one hole therein. For example, the hole(s) may have been arranged prior to the provision of the connector or during the provision optionally by the connector itself (during associated installation activity such as crimping or generally piercing activity, for example). Additionally or alternatively, at least one feature of the connector may define a connecting bridge, an arc or similar structure between and/or extending to the opposing sides of the substrate film, extending e.g., from one side of the substrate film over the edge thereof to the other side. Yet, the connector may specifically comprise at least one bridge or arc portion extending over the edge of the substrate film to connect two opposing portions, optionally being of monolithic or non-monolithic construction with each other and/or with the bridge or arc portion, of the connector on each side of the substrate film. Accordingly, in some embodiments the connector may have been configured at least functionally, if not physically, through the substrate film. Indeed, different embodiments for implementing the connector are discussed in more detail hereinafter.

As mentioned above, in various embodiments, the substrate film may have been prepared to define at least one ready-made, optionally drilled, punched, pierced, pressed, molded or cut, through-hole via which at least portion of the connector (contact element(s) and/or housing, for instance) extends to said first and second sides. Additionally or alternatively, at least a portion of the connector itself may have been configured to pierce, punch or otherwise penetrate through the substrate film, optionally by one or more of the contact elements thereof, preferably defining a crimp connection to the substrate film and particularly to one or more of the contact areas of the circuit design provided thereon. The crimp connection may include e.g. a spring connection.

In various embodiments, the aforementioned (thermo) plastic or thermoset molded material may be optionally configured to substantially fully cover the connector on a side of the substrate film receiving the molded material thereon. However, a portion of the connector that is located on the opposing side of the substrate film, and/or adjacent to the substrate film, shall preferably remain at least partially free from the molded material to enable connectivity with the external connecting element.

Yet, the aforesaid external connecting element may in various embodiments indeed refer to whatever feasible connecting feature of an external structure, external device, or external system, which is to be connected with the multilayer structure suggested herein via the connector of the claimed structure. Such external connecting element or generally connection may include or involve e.g. a (rigid) connector (e.g. with a one with rigid housing hosting a number of contact elements such as pins), flex cable, flex circuit or flex circuit board, contact pin(s), contact pad(s), solder connection, soldering to a circuit board, conductive adhesive such as epoxy or glue, crimp connection, welding, etc.

In various additional or supplementary embodiments, the circuit design further comprises a number of electronic components (passive components, active components, electromechanical components, optoelectronic components, and/or integrated circuits (IC), for example). The components may comprise e.g. mounted and/or printed components. Typically, one or more of these components have been at least electrically connected to one or more of the electrically conductive elements such as traces or specific contact areas of the circuit design. Yet, one or more of the components may have been at least partially embedded within the molded at least one plastic layer.

In various additional or supplementary embodiments, the circuit design further comprises a connecting component, optionally including a bridge, a circuit and/or other device, configured to connect multiple contact elements such as pins together to enable (high) current flow via them.

In various additional or supplementary embodiments, the connector comprises a preferably electrically insulating, optionally plastic, ceramic, a combination of such, or alike, housing for hosting the contact elements, such as pins.

The connector housing may optionally define e.g. a receptacle (such as one having a circumferential recess) for receiving at least portion of the external connecting element. Alternatively, it may define a protrusion to enter a receptacle defined by the external connecting element. The housing may further have been at least partially overmolded by one or more layers of the at least one plastic layer. Yet, in some embodiments, the receptacle or protrusion defined could be utilized to interface with a separate connectable portion of the connector itself.

The connector, or specifically the housing thereof, may be configured to contact any or both sides of the substrate film (and be optionally positioned on either). The housing may in some embodiments be configured to extend through the film. Yet, as mentioned hereinbefore, in some embodiments at least one feature of the connector may define a connecting bridge, an arc or similar structure between the opposing sides of the substrate film, extending from one side and e.g. over the edge of the substrate film to the other side, which may refer to the housing.

In various embodiments, the housing may comprise or consists of a pre-prepared separate piece of material, such as plastics.

In various embodiments, the connector housing may be at least partially defined by a plastic layer of the at least one plastic layer molded onto the substrate film, optionally comprising different material than at least one other layer of the at least one plastic layer (e.g. surrounding material, which may constitute e.g. volume and/or weight-wise the main material of the molded layer(s), for example). Still, the housing-establishing plastic layer may have been at least partially overmolded by at least one further plastic layer of the at least one plastic layer. In any case, the housing and/or other portion of the connector, such as a portion thereof facing and optionally contacting the external connector when mated therewith, may have been fully or at least partially established by said at least one molded plastic layer.

In various embodiments, the at least one plastic layer comprises at least two, optionally adjacent, layers of mutually different material.

In various embodiments, the at least one plastic layer may comprise a functional layer with thermally conductive (therefore playing role in heat management of the structure and e.g. embedded heat dissipating components) and/or optically transmissive or opaque material. The material may have been configured for transmitting and/or blocking (masking) light relative to selected features such as included optoelectronic components, e.g. light emitting (e.g. (O)LED) or receiving components (e.g. photodiode), or other layers in the structure among other potential uses. The functional layer optionally establishes at least portion of the connector housing and/or at least partially embedding one or more electronic components included in the circuit design.

In various embodiments, the connector is substantially rigid in contrast to e.g. typical flappy and flexible plastic film such as the substrate film(s) that may be commonly utilized in the structure.

In various embodiments, the connector comprises a number of bent or angled elements such as a bent or angled housing and/or one or more contact elements of the number of contact elements of the connector. For instance, the bent or angled elements may be configured to add to mechanical securing of the connector to the substrate and multilayer structure in general, while they may further enhance the related electrical coupling and/or facilitate connecting to the external connecting element. The bent elements may define curved and/or angular shapes.

In various embodiments, at least one contact element of said number of contact elements may be thus bent or angled. It may define a bent or angled shape, optionally substantially curved, angular or specifically essentially L-profile, so that a first portion of the contact element extends substantially perpendicular to the surface of the substrate film to connect with the external connecting element while a second portion of the contact element extends substantially along and/or parallel to the substrate film, contacting e.g. a contact area of the circuit design thereon.

In various embodiments, the edge of the substrate film is bent. It may contain or define a bent or angle relative to the remaining substrate film and/or other element of the structure, and/or e.g. a surface tangent or its normal of the element/overall structure, said substrate film optionally substantially defining, for example, an L-profile.

In various embodiments, one or more of the contact elements of the connector may extend laterally beyond the edge of the substrate film and/or transversely away from the substrate film, optionally thereby substantially defining an L-profile as is and/or relative to the film. One or more of the contact elements of the connector may thus be themselves bent or angled (thus including portions bent or angled relative to each other).

In various additional or supplementary embodiments, a plastic layer of said at least one plastic layer is located on one side of the substrate film, and the extended portions of the contact elements to contact the external connecting element are located on the same and/or opposite side of the substrate film. However, in some embodiments, there may alternatively or additionally be a plastic layer on the side of the substrate film that contains a specific portion of the connector (including e.g. the contact elements or at least their ends) that is configured to mate with the external connecting element.

In various additional or supplementary embodiments, a number of preferably elastic, mechanical locking members (defining or comprising e.g. barbed protrusions and/or bosses, or e.g. shapes/recesses to be mated with such) optionally defined by the molded at least one plastic layer, have been provided in the structure and configured to contact the external connecting element when mated and facilitate securing the external connecting element to the connector. In some embodiments, especially the connector, e.g. housing thereof, may contain one or more such locking members. The external connecting member may naturally include compatible (counterpart-type) locking members for the purpose (e.g. in a protrusion-recess fashion).

Additionally or alternatively, one or more locking members may have been provided in the connector, e.g. housing thereof, to enhance securing the connector itself or at least portion (in the case of initially multi-part connectors, see below) thereof to the remaining structure. The remaining structure such as the substrate film or molded layer may comprise define or comprise a number of compatible locking members, i.e. counterparts, of their own for securing the connector. Still, the connector may consist of several parts that are joined e.g. mechanically during the manufacturing of the multilayer structure. For example, the connector housing may be of multi-part type. Accordingly, the multilayer structure (e.g. substrate and/or the at least one molded layer) or a first portion, i.e. first joinable part, of the connector may define or host one or more locking members for securing a further portion (second joinable part) of the connector to the first portion and/or to the remaining multilayer structure.

The further portion may again naturally contain compatible locking members (counterparts) of its own.

In various additional or supplementary embodiments, there are electrically conductive areas of the circuit design on both sides of the substrate, said connector preferably directly electrically connecting to the areas via said number of contact members. Optionally a single contact member may directly mechanically and electrically connect to the areas on said both sides. To at least partially implement and/or secure the required mechanical and/or electrical connections, use of adhesive, optionally electrically conductive adhesive, is one feasible option.

In various additional or supplementary embodiments, at least one of the contact elements is configured to exert compressive force, optionally through spring force, on at least one contact area of the circuit design.

In various additional or supplementary embodiments, the aforesaid locking members comprises at least one springy member, such as a leaf spring, of electrically conductive material, contacting either directly or via intermediate electrically conductive elements, such as conductive adhesive or solder, both at least one contact element of the connector and at least one conductive area of the substrate film (e.g. contact area of the circuit design) to enhance electrical coupling between the two.

In various additional or supplementary embodiments, a mechanical sealing member or a plurality of such, optionally including a gasket, has been provided, e.g. on an area of the substrate film, on the at least one molded layer or specifically on a portion of the connector, configured so as to receive the external connecting member and/or a further portion of the connector and preferably to implement a hermetic seal between the connected elements.

In various additional or supplementary embodiments, the substrate film defines a recess of e.g. non-through type (e.g. a thermoformed recess), accommodating a portion of the connector, such as portion of the housing and/or contact elements thereof.

In various additional or supplementary embodiments, the substrate film is essentially planar. Alternatively, it may at least locally exhibit, even if potentially being generally substantially planar, an essentially three-dimensional shape, optionally curved, angled, slanted or specifically, e.g. a dome shape.

In various additional or supplementary embodiments, the connector further comprises a number of functional components such as electronic, optoelectronic, optoelectronic and/or micromechanical components, optionally including at least one integrated circuit.

In various additional or supplementary embodiments, the connector, optionally housing thereof, comprises a cavity (e.g. a through-hole or non-through hole) at least partially filled with the material of the at least one plastic layer. This may enhance securing of the connector to the substrate and/or multilayer structure in general.

In various embodiments, the structure may comprise a further substrate film having a further circuit design with electrically conductive elements thereon, wherein plastic material of one or more plastic layers of the at least one plastic layer has been provided between the substrate films, the circuit designs of the substrate films being optionally electrically connected by the connector and/or a connecting member or connecting component e.g. of a type discussed hereinbefore.

The number of contact elements of the connector may comprise a first contact element and the connector may further comprise a second contact element that is connected to the further circuit design of the further substrate film, the remote (from the substrate film) ends of said first and second contact elements extending from the respective substrate films being optionally located adjacent each other. The first and second contact elements may have been connected or be at least connectable together e.g. from the adjacent ends thereof, optionally utilizing a preferably removable external connecting element, such as an externally disposable jumper or other externally disposable connecting element. Alternatively, the adjacent ends of the contact elements may have been soldered together, for instance.

In various embodiments, the structure may comprise one or more elements of compressive material (configured e.g. as slips, dots, sheets, layers or other deposits), which has been preferably arranged between at least one contact element of the connector and the substrate film. The compressive material is advantageously electrically conductive. The compressive material may prevent e.g. contact degradation or breakage due to thermal expansion of materials in different circumstances (such as high temperatures or high temperature gradient involved in overmolding or other conditions).

In various additional or supplementary embodiments, the included substrate film(s) may comprise or consist of material(s) such as plastics, e.g. thermoplastic polymer, and/or organic or biomaterials with reference to e.g. wood, leather or fabric, or a combination of any of these materials with each other or with plastics or polymers or metals. A substrate film may generally comprise or consist of thermoplastic material. The film may be essentially flexible or bendable. In some embodiments, the film may alternatively be substantially rigid. The thickness of the film may vary depending on the embodiment; it may only be of few tenths or hundredths of a millimeter, or considerably thicker, in the magnitude of one or few millimeter(s), for example. In the case of several substrate films included in the multilayer structure, they be mutually similar or different in terms of dimensions (e.g. thickness and/or length/width), local shape(s) formed therein and/or used materials.

The substrate film(s) may, for example, comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

In a further, either supplementary or alternative, embodiment one or more of the included (substrate) films may at least partially be optically substantially opaque or at least translucent having regard to predefined wavelengths e.g. in visible spectrum. The film may have been provided with visually distinguishable, decorative/aesthetic and/or informative, features such as graphical pattern and/or color thereon or therein. The features may have been provided on the same side of the film with the electronics so that they have been also at least partially sealed by the plastic material(s) through the associated overmolding procedure. Accordingly, IML (in-mold labeling)/IMD (in-mold decoration) technique is applicable. The film(s) may be at least partially, i.e. at least in places, optically substantially transparent to radiation such as visible light emitted by the electronics thereon. The transmittance may be about 80%, 85%, 90%, 95% or higher, for example.

The plastic layer(s) molded onto the substrate film(s) may comprise materials such as polymer, organic, biomaterial, composite as well as any combination thereof. The molded material may comprise thermoplastic and/or thermosetting material(s). Thickness of the molded layer(s) may vary depending on the embodiment. It may be, for example, in the order of magnitude of one, few or tens of millimeters. The molded material may be e.g. electrically insulating.

In more detail, the at least one molded plastic layer may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In some embodiments, the (thermo)plastic material used to establish any of the molded layers comprises optically substantially opaque, transparent or translucent material enabling e.g. visible light to pass through it with negligible loss. The sufficient transmittance at desired wavelengths may be about 80%, 85%, 90% or 95% or higher, for example. Possible further, optionally also molded, (thermo)plastic material(s) used in the structure may be substantially opaque or translucent. In some embodiments, the further material(s) may be transparent.

In various additional or supplementary embodiments, the electrically conductive contact areas, elements, and/or other features of the circuit design, or other features provided on the substrate film(s) or in the structure in general, comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various embodiments, the contact elements of the connector may comprise e.g., at least one material selected from the group consisting of: copper, conductive ink, silver, gold, platinum, conductive adhesive, carbon fibre, zinc, brass, alloy, and silver alloy. Again, the materials may be optionally selected so as to exhibit e.g. desired optical property such as transparency, translucency or opaqueness in addition to desired electrical conductivity.

In various embodiments, at least one element of the connector, optionally comprising at least one contact element and/or connector housing, has been secured to the substrate film and/or contact area (of e.g. the circuit design) thereon using adhesive, conductive adhesive, chemical securement, thermal securement, mechanical securement, crimping, friction securement and/or compressive force such as spring force based securement.

In various additional or supplementary embodiments, the connector or especially at least one of its contact elements comprises at least one feature selected from the group consisting of: pin header, crimped connector, springy contact member, spring-loaded contact member, spring-loaded contact pin or slip, contact pad, contact area, contact pin, hole preferably with walls and/or bottom of conductive material, socket, female socket, male plug or socket, hybrid socket, pin socket, and spring pin socket.

Yet, a system comprising an embodiment of the multilayer structure and an embodiment of the external connecting element compatible for mating with the connector of the multilayer structure may be provided. The system may further comprise an embodiment of an external device or structure (such as essentially a host device or host structure of the multilayer structured described herein, e.g. electronic host device/structure or a vehicle or a vehicle part) whereto the multilayer structure is connected via the external connecting element. The external connecting element may be removable or integral element of the external device or structure.

According to one other embodiment of the present invention, a method for manufacturing a multilayer structure, comprises:

obtaining a substrate film comprising electrically substantially insulating material for accommodating electronics;

providing a circuit design comprising electrically conductive elements, optionally including traces, of electrically conductive material on the substrate film, said conductive elements defining a number of contact areas;

arranging at least one connector at the edge portion of the substrate film, the connector comprising a number of electrically conductive elongated contact elements connected to the contact areas of the conductive elements of the circuit design while being further configured to extend from the substrate film to couple to an external connecting element responsive to mating the external connecting element with the connector; and molding, optionally utilizing injection molding, preferably thermoplastic or thermoset material on the substrate film so as to at least partially cover the circuit design and only partially the connector, the covered portions including connection points of the contact elements with the contact areas and at least partially omitting the extended portions of the contact elements configured to couple to the external connecting element.

The circuit design may be provided utilizing one or more techniques and technologies. For instance, additive technologies such as printing (printed electronics such as screen printing or ink jetting) may be applied to provide conductive elements such as traces and contact areas on the substrate film. On the other hand, semi-additive or subtractive methods may be utilized, with reference to techniques applying e.g. engraving or etching, such as laser etching or engraving. Conductive material(s) such as the one(s) discussed herein elsewhere may be thus provided on the substrate film and then selectively removed. Mountable components may be provided as at least partially ready-made on the substrate film as well. Any or both sides of the substrate film may be provided with the circuit design(s). The designs may be connected via holes or edge(s) of the substrate film using conductive materials and elements (e.g. the connector or separate connecting members).

The method may further comprise providing additional material(s) or layer(s) (e.g. film(s) and/or molded layer(s)) and/or element(s) to the multilayer structure e.g. in connection with the above method items or afterwards. One or more additional (substrate) films or material layers may be provided as pre-prepared elements to the structure through lamination onto an existing layer using e.g. adhesive, heat and/or pressure, or establishing them directly from source material into the structure by molding, printing or deposition process, for example.

Thereby, e.g. a second (substrate) film may be optionally provided on the other side of the molded plastic layer or layers. The second film may be located in a mold together with the first substrate film so that a stacked structure is obtained by injecting the plastic material in between, or the second film may be provided afterwards using a suitable lamination technique if not being directly manufactured from source material(s) on the molded plastic layer. Any film such as the second film may also be provided with features such as graphics, other optical features and/or electronics on any side thereof (e.g. facing the molded plastic layer). Yet, it may have a protective purpose and/or other technical characteristics such as desired optical transmittance, appearance (e.g. color) or tactile feel. The second film may be operatively such as electrically connected to the first film, optionally by the integral connector and/or other connecting features such as one or more vias in the molded intermediate plastic layer, filled with conductive material or provided with conductor elements.

In some embodiments, the second substrate film could host a circuit design (e.g. part of the overall circuit design provided in the structure in several layers such as several substrate films and potentially connected together e.g. by the connector or other connecting members) with own contact elements that preferably extend to a common connector with the contact elements of the first substrate film. The contact elements from different substrate films could be then connected at the common connector, optionally by externally removable connecting element such as a jumper, as contemplated already hereinbefore.

In various embodiments, feasible molding methods for producing material layers and related features include e.g. injection molding in connection with e.g. thermoplastic materials and reactive molding such as reaction injection molding especially in connection with thermosets. In case of several plastic materials, they may be molded using a two-shot or generally, a multi-shot molding method. A molding machine with multiple molding units may be utilized. Alternatively, multiple machines or a single re-configurable machine could be used for sequentially providing several different materials.

Having regard to applicable molding process parameters, e.g. the aforementioned injection molding and reactive molding are generally trustworthy options depending on the used materials, desired material properties, molding equipment, etc. To cause minimum stress to the underlying features such as electronics, low-pressure (e.g. less than about 10 bar) molding may be used in selected molding operations, such as overmolding of a side of the substrate film having circuitry or generally circuit design thereon. Different molding techniques may be applied to yield different material properties to the structure in terms of e.g. desired mechanical properties such as strength.

In various embodiments, at least portion of the connector, e.g. of the housing thereof, may be established from the molded material.

In various embodiments, multi-shot molding may be applied to enable building of different layers of potentially but not necessarily different molding materials in the structure. At least one shot could be used to generally cover desired portions of the circuit design and/or of the connector, while at least a further shot—taking place e.g. between other shots—could build at least portion of the connector such as at least portion of the housing thereof.

In various embodiments, the electrical connector may be secured on the substrate film(s) as what comes to at least its pre-manufactured part or parts (as per being not directly manufactured on the substrate film/in the structure) utilizing any suitable technique(s), such as bonding e.g. thermally, welding, crimping or gluing using applicable adhesive. Preferably such securement takes place prior to overmolding of the connector.

In various embodiments, one or more substrate films may be formed, optionally thermoformed or cold formed, to at least locally if not more generally exhibit a desired, often essentially three-dimensional, target shape such as recess or curved shape preferably following the provision of conductors and optional further electronics such as electronic components thereon but prior to molding the plastic layer. Forming may be utilized to define e.g. a recess in the film, which may be used to accommodate at least portion of a feature such as connector or electronic component.

The used materials, dimensions, positioning and other configuration of the elements such as electronics already residing on the film prior to forming and/or molding shall be selected so as to withstand the forces induced thereto by forming/molding without breakage.

In those embodiments where a substrate film is to be provided with at least one hole such as a through-hole, the hole may be provided by molding (or generally, directly establishing the substrate film such that it contains the hole), drilling, carving, sawing, etching, piercing (e.g. in connection with crimping), cutting (e.g. with laser or mechanical blade) or using any other feasible method as being understood by a person skilled in the art.

Yet, the at least one hole may have a desired shape, i.e. a substantially circular or angular shape, e.g. a rectangular shape. Preferably the hole is shaped and dimensioned so as to match the shapes/dimensions of any element such as an element (e.g. component) of the circuit design or e.g., the connector element to be at least partially accommodated by the hole, in a selected fashion and to desired extent. For example, the hole may indeed enable a number of contact elements of the connector element to pass through.

In some embodiments, at least one of the holes of the at least one hole may be initially formed as a blind hole in the substrate by thinning, for example. In that case, upon providing the connector (e.g. crimped connector) to the substrate, protrusion type contact elements thereof, such as pins, may be configured to pierce or punch through the bottom of the blind hole to enter the other side of the concerned film. In some supplementary or alternative embodiments, however, contact element(s) such pins(s) of the connector may be configured to pierce or punch through the substrate at location(s) not provided with blind hole(s) or other particularly processed-for-piercing region(s) upfront, which is convenient from the standpoint of reducing the number of required manufacturing steps or operations. Accordingly, the element(s) to be provided through the film can be themselves utilized for producing the necessary hole therein upon installation, with reference to e.g. crimped connectors or connector parts.

In various embodiments, in addition to or instead of providing e.g. a portion of the connector through a substrate film, a number of other holes or vias may be established in the film(s) and/or other layer(s) such as molded layer(s) of the multilayer structure for e.g. electrically and/or optically connecting the opposing first and second sides thereof together, in practice referring to e.g. electronics on both sides of the concerned film/layer together. Generally, such vias or basically through-holes may be correspondingly provided by molding (or generally, directly establishing the substrate film with the hole), drilling, chemically (through etching, for example), carving, sawing, etching, cutting e.g. with laser or mechanical blade, or using any other feasible method as being understood by a person skilled in the art. The vias may have a desired cross-sectional shape, i.e. a substantially circular or angular shape, e.g. a rectangular shape, or elongated (slit) shape.

The aforementioned vias may be provided with selected material(s) such as electrically conductive and/or optically transmissive materials using a selected filling method such as molding, mounting or printing. The materials may include adhesives, epoxies, metals, conductive ink, fluidic material such as gaseous or liquid matter, etc. The material may be formable so that it withstands e.g. bending strain. In some embodiments, the via(s) may remain open (unfilled) so as to enable e.g. internal sensor such as atmospheric sensor to operably couple to the environment therethrough.

In various embodiments and as already briefly discussed hereinbefore, one or more features, such as electronic components or other elements, may be provided to a target substrate such as a film or a molded layer of the multilayer structure by (additive) printed electronics technology, subtractive manufacturing techniques and/or mounting with reference to e.g. SMD/SMT (surface-mount device/surface-mount technology), for example. One or more of the features may be provided on substrate areas that are at least partially covered by the molded plastic so that the features themselves are also at least partially covered by it.

The mutual execution order of various method items may vary and be determined case-specifically in each particular embodiment. For example, a second side of the first substrate film may be overmolded prior to a first side, after the first side or substantially simultaneously; for instance, molded material may be injected so that it propagates from the initial side to the opposite side of the film e.g. via an existing or pressure-induced through-hole therein.

The previously presented considerations concerning the various embodiments of the multilayer structure may be flexibly applied to the embodiments of the related manufacturing method mutatis mutandis, and vice versa, as being appreciated by a skilled person. Yet, various embodiments or related features may be flexibly combined by a person skilled in the art to come up with new combinations of features generally disclosed herein.

The utility of the present invention arises from a plurality of issues depending on the embodiment.

First of all, by providing a desired electrical, or specifically galvanic, and/or optical, among other options, connectivity for signal (data) and/or power transfer the discussed functional multilayer structure may be operatively conveniently embodied in a larger ensemble further including other devices such as a so-called host device or host system, or transversely, a sub-device/sub-component or a sub-system. As the included integrated (in-mold) connector may be configured to provide galvanic electrical connectivity for signal and/or power transfer and optionally a further connectivity, preferably including optical and/or thermal connectivity, the connector may essentially become, in associated embodiments, a hybrid connector. In some applications, the connector may be utilized to optionally dynamically (changeably and/or upon need) enable connecting different integral elements of the structure together, with reference to e.g. circuit designs and related elements provided on different substrates in the overall multilayer structure.

Secondly, the connector and resulting connectivity of the multilayer structure may be cleverly arranged at and via the edges of the substrate film, which in many embodiments also corresponds to the outer edge of the multilayer structure itself. Accordingly, more central areas and volumes of the substrate and the structure in general may be better spared for use in other purposes, which may include but is certainly not limited to positioning of components or application as optically or electrically functional space, potentially having indicative (output), aesthetic or sensitive (input, e.g. sensing area or volume) purpose or role.

Indeed, there are numerous scenarios wherein the central portion of the substrate film or of the overall structure is externally perceivable due to e.g., transparent materials used and/or positioning of the structure, which may have both functional and aesthetic implications, considering various applications wherein electronics-containing multilayer structure should remain at least partially exposed to the environment. This may be the case with different electronic appliances (consumer grade and professional devices both alike in the field of e.g. communication devices, computers, home appliances, industrial devices and machinery) and e.g. vehicle electronics in terms of data input, output and generally visual (e.g. informative or aesthetic) function. In vehicles, the multilayer structures discussed herein may find their way in a variety of panels, displays or other in-vehicle or exterior surfaces and components, for example. The connection area at the edge of the substrate may be then masked from the external perception with ease by suitable integral or external masking layers or elements such as frames, while the central portions are available for other uses such as data input involving integration of sensing elements such as optical (e.g. gesture, ambient light, etc.) or pressure (e.g. touch) sensors or at least associate detection areas thereat. Yet, indicative/data output elements such as light output devices (LEDs etc.) may be arranged at the central portion or be configured at least to exploit it as a part of the data output path without problems arising from connectivity related elements already reserving the desired space.

In a nutshell, by different embodiments of the multilayer structure and connector discussed herein, preferred connections to external devices, systems and structures may be conveniently, reliably, and with good visual quality integrated, secured and embedded within a functional, e.g. circuit design and various electronics-containing, multilayer structure generally manufactured in accordance with the IMSE principles, for instance.

In some embodiments, conductive region(s) may be first provided on a substrate film, either on one or both sides/surfaces thereof, e.g. by printed electronics technology. Subsequently, the connector may be then provided to the substrate film such that it extends to any single or both sides of the film, optionally by providing it partially through a number of pre-prepared holes in the film or by creating the holes on the fly through crimping the connector and/or generally piercing the film by the (contact elements of the) connector, for instance. Additionally or alternatively, connection around the edge of the substrate may be exploited for connecting or generally providing mutually connected connector portions on both sides of the substrate. Nevertheless, the connector can be said to be provided at least functionally through the substrate film in use cases where it appears beneficial.

A molded plastic layer, or layers, may be further utilized to secure the connector to the substrate in addition to protecting it. In some embodiments even part of the connector, such as the housing, may be fully or partially established from plastics molded on the substrate film instead of or in addition to the use of pre-prepared connector portions or parts such as pre-manufactured connector housing that could be utilized as an insert during injection molding to integrate it with the multilayer structure. Through establishing at least part of the connector (e.g. at least part of the housing) from the overmolded material, design flexibility gains could be obtained in contrast to the selection of readily-available predefined connector/housing designs, some of which may not even be suitable for use as inserts in molding processes due to their material or structural design. Utilization of multi-shot molding optionally together with different molding materials enables selection of best possible molding parameters and optionally materials for each shot, i.e. for each purpose. Protective general molding layer/shot is therefore not limited by the tolerance or material requirements of the connector housing if the housing is provided by a further layer/shot, for example. Yet, $1^{st}$ shot molding procedure may be thus simplified as moving cores may be omitted.

Depending on the embodiment, both custom-made connectors and commonly available connectors or connector components (e.g. insert housing and/or contacts) may be utilized in conjunction with the present invention. The connector may comprise e.g. multiple pins as contact elements to make a connection to the printed wiring pads or other conductive regions of the circuit design provided on the film. The spring force of the contact elements such as pins of the conductor element may be configured so as target the conductive contact areas on the substrate film to enhance or secure physical and thus also electrical contact therebetween. In some embodiments, bendable contact elements such as pins may be applied (bent) so as to enhance the contact with the conductive areas on the substrate e.g. by the associated spring force. The force subjected by the contact elements to the conductive areas on the substrate may include a compressive force as being appreciated by a person skilled in the art.

Generally, the connector shall preferably comprise electrically conductive material such as preferred metal (silver, copper, gold, etc.) or e.g. conductive polymer, which is used to establish electrical connection to the circuit design on one or more substrates, or generally layers, of the multilayer structure, internal connection(s) of the connector element and connection to the compatible counterparts of an external connecting element such as connector of an external device or of a connecting cable therefor.

In various embodiments, the same contact elements provided in the connector may be conveniently configured to implement electrical coupling both with the circuit design of the multilayer structure and the external connector/device. For example, a number of elongated contact elements may be directly (without intermediate conductive elements) coupled from one end or nearer to one end to the circuit design of the multilayer structure and from the other end to the external connecting element, while optionally being at least partially enclosed e.g. from a center portion within a connector housing of e.g. plastic, ceramic, rubbery or other material, which may be electrically insulating. In some embodiments, at least one contact element of the connector may incorporate multiple coupled component or constituent elements of potentially different electrically conductive materials that together constitute the contact element. The contact elements may thus be but do not necessarily have to be monolithic or single piece elements. In some embodiments, multiple contact elements could also share a common component element.

The connector shall preferably further incorporate, e.g. in its housing and/or included electrical conductors such as contact elements, structurally sufficiently durable material(s) such as metal, plastic, or ceramic material, thus tolerating repeated installation and removal of an external element such as external connector relative thereto.

Yet, the connector or the multilayer structure in general may be supplemented with a number of locking members such as (barbed) protrusions, bosses, recesses and/or boss-base combinations as already discussed hereinbefore. For instance, one or more hole(s) or other areas may be defined in the substrate film through which the molded plastic flows during molding and defines one or more of such members. Also pre-prepared elements such as connector parts (e.g. housing and/or contact elements) may contain locking member(s). One potential function of the locking members may be in retaining the external connecting element, such as an external connector, in a correct position, e.g. mated with the integral connector, and preventing it from getting loose unintentionally, for example. Yet, the locking members may be used to secure connector parts together or to the remaining structure.

In various embodiments, the connector or a component/portion thereof (e.g. housing) may be of sealed type, e.g. waterproof or dustproof or otherwise environmentally sealed type, and thus generally offer a desired level of protection (e.g. desired IP rating, International Protection/Ingress Protection) having regard to selected solids, fluids, gases, liquids, etc. The connector may include a sealing member such as gasket for sealing joints e.g. between different portions of the connector, between the remaining structure (e.g. substrate film) and the connector, or between the connector and the external connecting element.

Further features such as molded features, screws or rivets may be applied in securing the suggested multilayer structure to an external structure, system, or device, and/or a so-called host device. The multilayer structure may define e.g. a hole, or more specifically a threaded hole dimensioned for a selected threaded fixing element such as a screw.

The suggested manufacturing method applying overmolding is relatively straightforward and what is also considered beneficial, does not necessitate adopting completely new or different manufacturing technologies just for producing the sufficient connectivity in the context of e.g. printed and in-mold electronics. By forming the film(s) to a desired 3D shape e.g. after the provision of conductors, connector(s) and/or optionally further electronics thereon while the substrate film was still substantially planar, may reduce or obviate a need for potentially tedious and error prone 3D assembly of electronics on a substrate. Obviously, 3D assembly of elements such as electronic components or connector(s) is still feasible.

A similar connector could also find use in other scenarios wherein the electrical connection is potentially unnecessary, but e.g. optical and/or thermal connection is desired. Instead or in addition to conductive material, electrical wiring or e.g. printed traces, the connector may comprise e.g. optical fiber.

As alluded to above, the obtained multilayer structure may be used to establish a desired device or module in different host elements such as vehicles or specifically (in-)vehicle electronics, lighting devices including vehicle lighting, user interfaces in vehicles and elsewhere, dashboard electronics, in-vehicle entertainment devices and systems, vehicle interior or exterior panels, intelligent garment (e.g. shirt, jacket, or trousers, or e.g. a compression garment), other piece of wearable electronics (e.g. wristop device, headwear, or footwear), personal communications devices (e.g. smartphone, phablet or tablet) and other electronics. The integration level of the obtained structure may be high and desired dimensions such as the thickness thereof small.

The used film(s) may contain graphics and other visually and/or tactilely detectable features thereon, whereupon the film may have aesthetic and/or informative effect in addition to hosting and protecting the electronics. The film(s) may be translucent or opaque at least in places. They may exhibit a desired color or comprise portions exhibiting a desired color to the corresponding portions of the structure.

The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces. Exterior film(s) of the multilayer structure may be configured to establish at least a portion of outer and/or inner surface of the associated host product or host structure.

The visual features such as patterns or coloring may be provided via internal layers, e.g. on the side of a (substrate) film that is facing the molded plastics so that the features remain isolated and thus protected from environmental effects at least by the thickness of the film and optionally of the molded layer depending on which side the film was provided relative to the environmental threat. Accordingly, different impacts, rubbing, chemicals, etc. that could easily damage e.g. painted, printed or mounted surface features do not affect or reach the features. The film may be easily manufactured or processed, optionally cut, into a desired shape with necessary characteristics such as holes or notches for exposing the underlying features such as the molded material.

The molded plastic material(s) may be optimized for various purposes including securing the connector and/or various electronics. Yet, the material(s) may be configured to protect the connector, electronics and/or other features included in the multilayer structure from e.g. environmental conditions such as moisture, heat, cold, dirt, shocks, etc.

The molded material(s) may further have desired properties in view of light transmittance and/or elasticity, for example. In case the embedded electronics includes light- or other radiation-emitting or receiving components, the material(s) may have been selected so as to have sufficient optical transmittance to enable light/radiation transmission therethrough at least selectively (e.g. having regard to certain wavelengths).

Further characteristics and utilities of various embodiments of the present invention are discussed hereinafter in the detailed description.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

When "different" or "various" embodiments of the multilayer structure, related method of manufacture, or features included therein are referred to, the embodiments are to be considered mutually supplementary and may thus be realized by common or joint embodiments, unless being otherwise explicitly stated or being otherwise clear to a person skilled in the art that the concerned solutions are mutually clearly exclusive and essentially e.g. alternative solutions for implementing the very same feature of the overall solution.

Different embodiments of the present invention are also disclosed in the attached dependent claims.

BRIEF DESCRIPTION OF THE DRAWINGS

Next the present invention will be described in a greater detail with reference to the accompanying drawings, in which.

DETAILED DESCRIPTION

Figure 1:
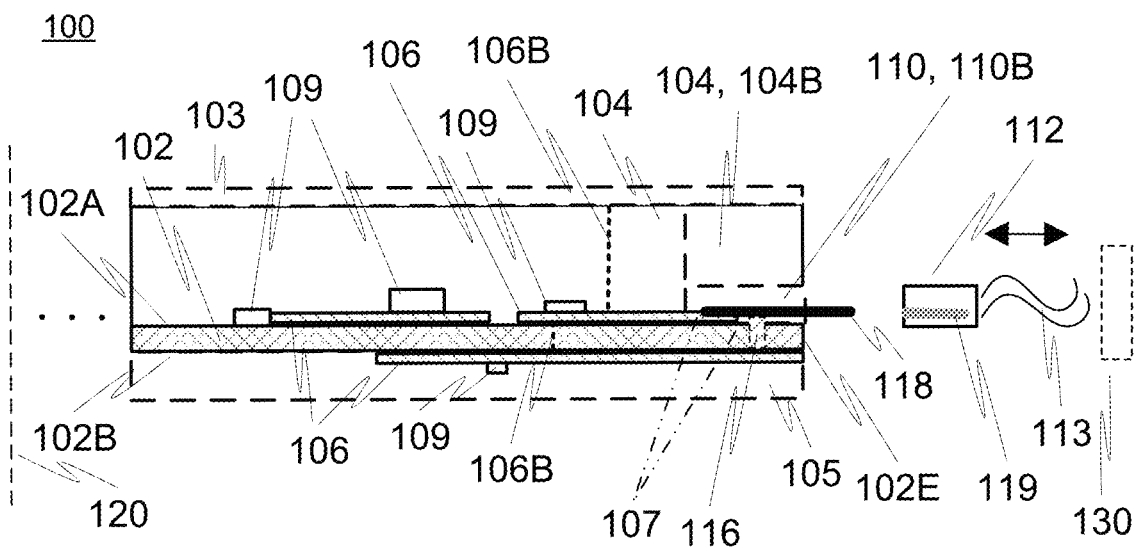
FIG. 1 illustrates, via a cross-sectional side view, a general embodiment of a multilayer structure in accordance with the present invention, incorporating an in-mold connector.

FIG. 1 illustrates, via a (cross-sectional) side view, an embodiment 100 of a multilayer structure in accordance with the present invention.

The multilayer structure 100 may establish an end product per se, e.g. an electronic device, or be disposed in or at least connected to a host device, host system or host structure 120 as an aggregate part or module, for example. It 100 may comprise a number of other elements or layers not explicitly shown in the figure for clarity reasons. Item 130 refers to an external device, system, or structure whereto the structure 100 functionally, in terms of e.g. power and/or data signal transfer, connects via an included connector 110. In some embodiments the connected external entity 130 may be at least part of the host entity 120.

The structure 100 contains at least one, so-called first, substrate film 102 with two opposing sides 102A, 102B that typically have substantially greater dimensions (width, length) than the actual material thickness of the film 102, wherein the thickness may only be e.g. few millimetres or even considerably less (e.g. few tenths or hundredths of a mm). The film 102 and the remaining surrounding structure are shown as planar for illustrative purposes but as discussed herein, it 102 may have been formed to exhibit a desired overall and/or local 3D-shape.

Item 104 refers to a plastic layer molded upon the film 102. In some embodiments, there may be at least one other, supplementary or alternative, molded plastic layer or otherwise established layer 105 in the structure 100 on the other, opposing side 102B of the film 102 as shown in the figure. It 105 may have a protective, securing, other functional and/or aesthetic purpose, for instance. Several molded plastic layers 104, 104B, 105 may be generally established as adjacent, potentially stacked, layers and/or on different sides of the film 102 by a number of molding shots, wherein utilizing e.g. openings provided in the film 102 both sides of the film 102 can be overmolded also using a single shot instead of or in addition to multiple ones. In some embodiments, at least portion of the other plastic layer 105 may thus result from plastic material of the first layer 104 penetrating and flowing into the opposing side of the film 104 during molding, e.g. via a thinned portion or pre-prepared hole therein (merely exemplary hole in the substrate film 102 in general has been indicated as item 116 in the fig; as discussed also herein elsewhere, one or more holes may have been established in the film 102 for various purposes such as communication or fixing, not only for molding), or vice versa. Accordingly, the layer 105 may establish desired functional forms and features such as securing or protective features on the film 102.

On the other side of the molded plastic layer 104, a further (substrate) film 103 may have been provided. This optional film 103 of same or different material with the first film 102 may accommodate e.g. electronics, graphics and/or other features considered advantageous. The film 103 may include e.g. a circuit design comprising printed and/or mounted elements (traces, components, etc.), but these have been omitted from FIG. 1 in favour of clarity. Accordingly, the films 102, 103 or features thereon such as circuit designs or components may be connected together as discussed herein elsewhere, for example.

Nevertheless, the first film 102 preferably accommodates a circuit design on either or both sides 102A, 102B and respective surfaces thereof, comprising a number of electrically conductive elements 106, defining e.g. contact areas 107 (e.g. pads, also on either or both sides) and wiring/ electrical conductor traces, potentially but not necessarily, as discussed hereinbefore, additively produced thereon by means of printed electronics technology such as screen printing, tampo printing, flexography or ink jetting.

A number of elements such as electronic components and/or other functional/decorative components or elements 109, such as optical elements (lightguide, reflector, diffusor, diffractor, mask, graphical element, etc.), micromechanical, electromechanical and/or thermal management elements, may have been further provided in the structure 100, preferably upon the film 102 on either or both sides 102A, 102B and respective surfaces thereof, and further preferably forming part of the circuit design. A number of e.g. electrically conductive vias (e.g. holes filled with conductive element/ material) or other elements 106B may have been arranged through the substrate film(s) 102, 103 and/or other layers, e.g. through molded layer(s) 104, 105, to connect e.g. the circuitry or other features of different material layers together or to external elements.

The circuit design and related components or elements 109 may further comprise a number of (internal) connecting components, optionally including a bridge, a circuit and/or other device, configured to connect other electrically conductive elements such as multiple contact elements at least operatively such as electrically together to enable high current flow via them. The connecting components may be (directly) coupled to the conductive elements 106 and e.g. positioned on or adjacent to them, for instance.

In addition to or instead of printed implementations, various elements and components 109 discussed herein may include one or more ready-made components that are disposable such as mountable. These components may be mounted on the substrate film(s) 102, 103 of the structure 100, for example. The (mountable) components may especially include so-called surface-mount components or surface-mount devices (SMD), which may essentially be electronic components but also optical, micromechanical, electromechanical or thermal management components (insulative, conductive, e.g. heat sinks, etc.) among other options. For example, adhesive or mechanical locking members may be utilized for mechanically securing them on the substrate.

Additional electrically conductive material(s) such as conductive adhesive and/or solder may be applied for establishing or enhancing electrical and potentially also mechanical connections between selected features such as conductive areas 106 and the components 109. In more general terms, electrically conductive or non-conductive adhesive(s) may be utilized in various embodiments of the present invention to secure features such as the connector(s), their components and/or other elements such as electronic, optoelectronic, micromechanical or thermal management components to the substrate and specifically e.g. to the circuit design thereon.

In view of the above, the components 109 may in many embodiments include electronic components such as passive components, active components, optoelectronic (or optoelectrical) components, electromechanical components, ICs (integrated circuit), printed, such as screen printed, components and/or electronic sub-assemblies. For instance, one or more components 109 may have been first provided on a separate substrate, e.g. a circuit board such as an FPC (flexible printed circuit) or e.g. rigid, e.g. FR4 type (flame retardant), board, and subsequently attached as a whole (i.e. as a sub-assembly) to the target substrate 102.

Generally, the multilayer 100 structure may comprise or implement e.g. at least one feature (component, element) selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, data storage element, electronic sub-assembly, light directing element, lightguide, lens and reflector.

Item 110 refers to a preferably at least electrical connector that has been provided at the edge 102E (periphery) of the substrate film 102. The "edge" refers herein to the immediate edge of the substrate film or at least to a greater periphery region that spans e.g. about 10%, 20%, 30%, or 40% of the edge-neighbouring surface area or volume of the film 102 or less. In some embodiments the connector 110 may contain a housing, or "body member", 110B of e.g. monolithic or composite construction provided at the edge 102E. The housing 110B may thus either fully (in its entirety) or at least partially lie on the edge region. The connector 110 such as the housing/body member 110B thereof may comprise e.g. electrically substantially insulating material such as selected plastics (e.g. polycarbonate, polyimide), rubbery or ceramic material as contemplated hereinbefore. It is still to be understood by a skilled person that the connector 110 included in the structure 100 does not have to necessarily contain a particular dedicated, e.g. insert or direct in situ molding based, housing 110B, with reference to e.g. a pin header or card edge connection type arrangements adopted, because the necessary contact elements 118 included may be still protected and potentially secured by the molded plastics layer(s) 104, 105, and their 118 installation does not require a housing 110B either.

In terms of providing electrical connectivity, the connector 110, indeed, preferably comprises a number of electrically conductive contact elements 118, such as pins or other features. The contact elements 118 may optionally stick out from the possible housing 110B or from the bottom of a receptacle defined by it, at least to an extent to enable desired level of external connectivity having regard to the element 112. The contact elements 118 of the connector 110 may, for example, extend laterally (essentially e.g. along or parallel to the surface direction or major orientation direction of the substrate film 102) beyond the edge of the substrate film 102, which has been illustrated in FIG. 1.

Figure 2A:
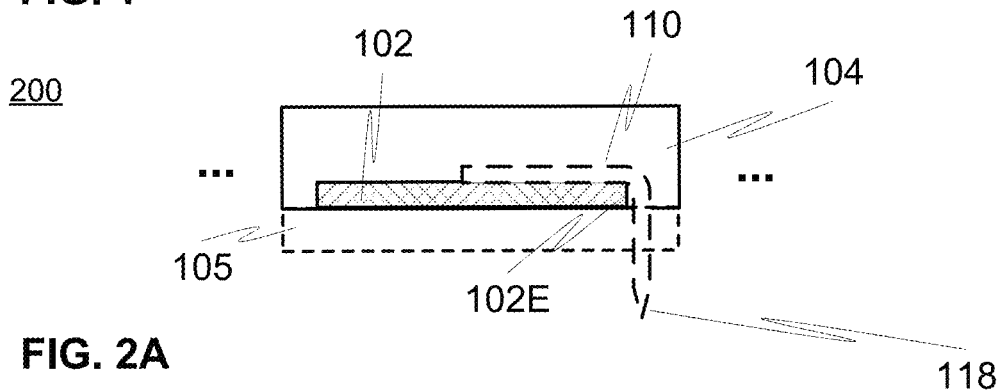
FIG. 2A depicts a cross-sectional side view of an embodiment of the multilayer structure in accordance with the present invention.
Figure 2B:
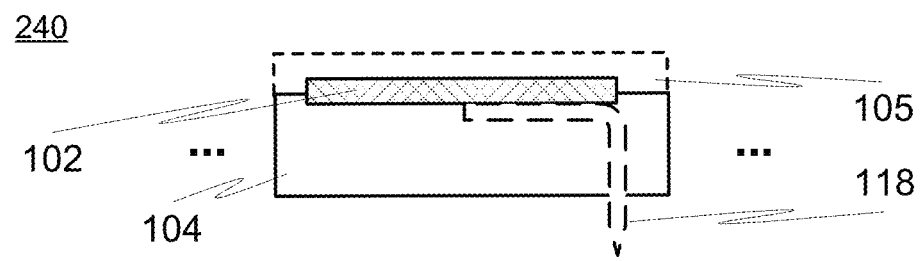
FIG. 2B depicts a further cross-sectional side view of an embodiment of the multilayer structure in accordance with the present invention.

Alternatively, one more contact elements 118 could have been configured, by an included bent or otherwise, to extend more transversely, optionally parallel to the surface normal, away from the substrate film 102 at the edge thereof (see also e.g. the embodiments of FIGS. 2A-2B).

The contact elements 118 are preferably configured (material, dimensions/shapes, positioning and alignment, etc.) and utilized to electrically (galvanically) couple an external connecting element such as another connector 112, equipped e.g. with compatible contact elements 119 (e.g. pins or pin receptacles), with the circuit design (typically selected electrically conductive areas 106 thereof) of the multilayer structure 100. The external connecting element 112 may provide electrical connection e.g. through cabling 113 between the internals of the multilayer structure 100 and external or host device(s) 130 associated therewith.

In various preferred embodiments, the contact element(s) 118 do not have to necessarily pierce or penetrate into or through the substrate films 102, 103 (unless e.g. crimped contact element(s) 118 are utilized). However, the connector 110 may be in some embodiments (not particularly illustrated in FIG. 1) provided or assembled relative to the substrate film 102 so that it extends to both sides 102A, 102B of the film 102 in terms of at least some elements of the connector 110 such as housing 110B and/or contact element(s) 118. This may be for facilitating or enhancing the securement to the substrate film 102 and/or for enhancing electrical contact with the circuit design 106 and contact areas 107 thereon, for example. In such scenarios, a portion of the connector 110 may have been directed around and/or through the substrate film 102. To achieve this, suitably dimensioned and shaped such as curved or angular (e.g. bent) contact elements 118 and/or pre-prepared (e.g. by drilling, cutting, etching or molding) or dynamically created (upon piercing/crimping of the connector 110, for example) hole(s) 116 may have been utilized. For example, at least one or more contact elements 118 or their portions may have been conveyed from the initial installation side 102A, 102B to the opposite side 102B, 102A of the substrate film 102 to enable e.g. electrical coupling around and/or through the substrate film 102 with the circuit design and/or with the external connecting element 112.

In various embodiments there may indeed be one or multiple through or non-through (blind) holes 116 arranged in the substrate film 102, For example, a portion such as an end portion of any or each contact element 118 to contact with the circuit design on the substrate film 102 may be associated with a blind or through-hole in the film 102 with reference to e.g. crimped connectors or specifically, their contact elements and associated crimping spikes.

The housing 110B of the connector 110 element, however, may be located on either side 102A, 102B side of the film 102 substantially completely, with reference to the scenario sketched in FIG. 1, for example. In other embodiments, also the housing 110B itself may have been partially arranged through and/or around (the edge of) the film 102.

One or more locking members (elements) may have been additionally provided on either or both sides 102A, 102B of the substrate 102 for additionally securing (at least portion of) the connector 110 and/or external connecting element 112 as deliberated herein earlier.

Based on the foregoing, the connector 110, or different elements thereof, may thus have been secured to the substrate film 102 using a variety of means with reference to configuration and dimensioning of its various internal features of the connector 110 such as housing 110B and contact elements 118, and use of additional securing features such as plastic 104, 105 molded thereon, locking members, and/or e.g. non-conductive adhesive, conductive adhesive, paste, etc.

For example, in some embodiments incorporating at least one hole 116 in the substrate film 102, the housing 110B and/or contact elements 118 may have been dimensioned and/or shaped, either initially or subsequent to arranging e.g. a portion of the connector 110 through the film 102, such that there is no excessive or substantial slack between the connector 110 and the edges of the hole 116 and/or such that the connector 110 cannot be provided at least completely through the film 102 in either or both directions, not at least without enlarging the hole 116 and potential other surrounding features. In some embodiments, the molded plastics 104, 105 may be used to seal the hole 116. In some embodiments, the connector 110 or specifically the housing 110B thereof may include a feature such as a flange or generally a bulging portion that prevents it from fully fitting through the hole 116.

In various embodiments, the connector 110 or e.g. specifically the aforesaid housing 110B thereof may be made substantially rigid or stiff. It may then better withstand e.g. repeated physical mounting and removal of external connectors 112 into or away from contact therewith, respectively. The mounting and removal may refer to simple push and pull type actions or require more complex activities if the procedure involves use of e.g. additional locking members as discussed hereinafter. The rigidity or generally durability of the connector 110 may be obtained by means of suitable materials and related dimensions such as material thicknesses. The connector 110 may in addition to or instead of rigid portions include elastic, flexible and/or springy portions e.g. in the contact elements 118 or housing 110B thereof.

Yet, the multilayer structure 100 or specifically connector 110 thereof may contain one or more mechanical locking members (not shown in FIG. 1 for clarity reasons) for securing the external connector 112. Such member(s) may be established from the molded plastics, for example.

In various embodiments, the molded layer(s) 104, 105 preferably embed at least a portion of the circuit design and of the connector 118, such as their interconnection.

In some embodiments, subsequent to mating of the external connector 112, desired portion(s) of the resulting aggregate structure 100, 112 including e.g. the connection region may be provided with additional material to further protect and/or secure, among other potential objectives, the connection and related elements. For example, low pressure molding or resin dispensing (provision of epoxy) of suitable plastic or other material may be utilized for the purpose.

The film(s) 102, 103 may have been shaped according to the requirements set by each use scenario. Therefore, forming such as thermoforming may have been applied to the film 102, 103, optionally subsequent to provision of at least some features such as conductive areas, connector and/or components of the circuit design thereon, to at least locally provide e.g. a desired 3D shape such as a curved, pocket or protrusion shape in the film 102, 103.

The features described having regard to the sketch of FIG. 1 are freely and selectively applicable in connection with various embodiments of the connector elements and multilayer structures of the present invention in general, including the solutions explained in more detail hereinbelow, unless otherwise stated or being otherwise clear to a person skilled in the art with reference to e.g. clearly mutually exclusive features. Yet, various features of the embodiments described hereinbelow are similarly freely, selectively mutually combinable as being easily apprehended by the skilled person.

FIG. 2A depicts, at 200, an embodiment (or a portion of an embodiment) of a multilayer structure of the present invention via a cross-sectional side sketch.

The discussion above regarding the present invention in general (summary) and FIG. 1 generally applies also to the scenario of FIG. 2A. The connector 110 comprises one or more contact elements 118 that have been arranged in a bent configuration at the edge 102E of the substrate film 102. Yet, the contact elements 118 have been essentially configured near the edge 102E on at least one side of the substrate film 102. There the contact elements 118 may further connect to the contact areas 107 of the underlying circuit design, such as additively produced (printed, for example) planar elements of electrically conductive material, according to the basic principles of the present invention (circuit design and related contact areas 107 not illustrated in FIG. 2A in favour of clarity). The contact elements 118 may be in galvanic contact with the conductive ink or other electrically conductive material of the circuit design.

Figure 13:
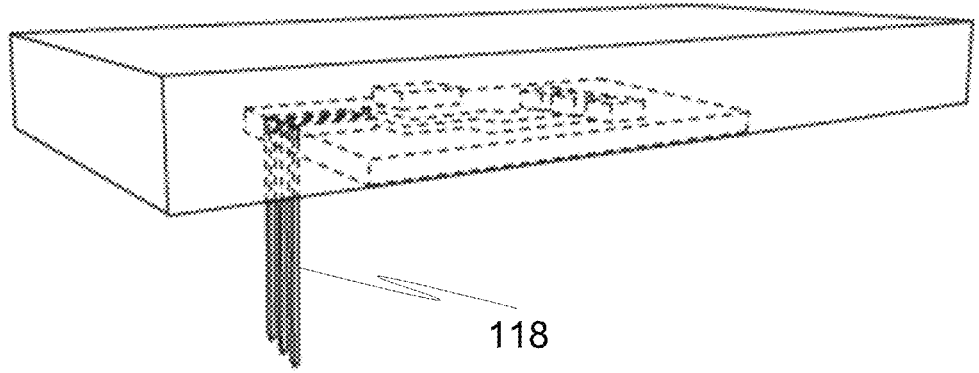
FIGS. 13 and 14 illustrate via axonometric sketches certain applicable embodiments of the present invention such as the ones already depicted in FIG. 2A via a cross-sectional side view.
Figure 14:
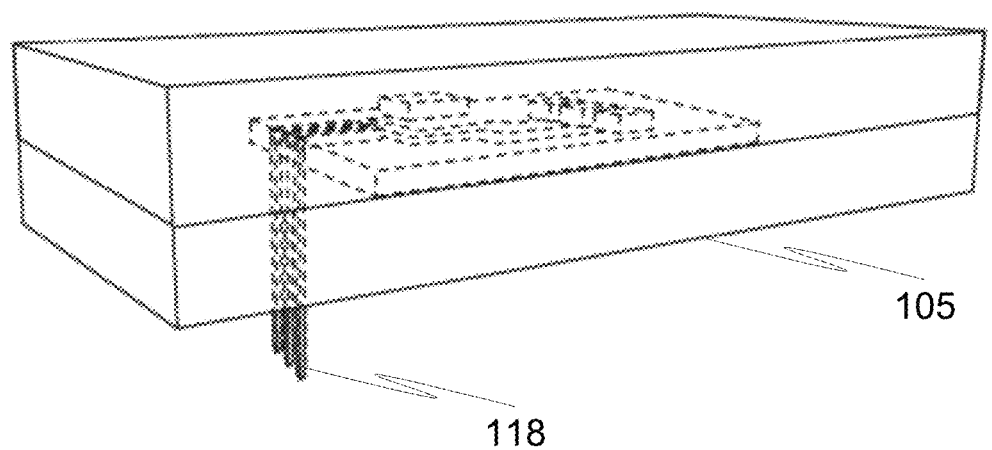

As illustrated by way of example, the contact elements 118 have indeed been configured to have a bent portion. Specifically, the contact elements 118 have been configured so as to bend around the edge 102E and protrude away from the substrate film 102 towards the environment from the opposite side (bottom side in the shown orientation). There the exposed ends of the contact elements 118 may galvanically connect to the external connecting element 112 and especially to dimensions-wise compatible or "matching" conductive elements thereof, with reference to e.g. sockets or other receptacles. The structure 200 may include at least one further material layer such as molded plastic layer 105 through which the contact elements 118 extend on the opposite side. Further substrate film(s) may be included as well. FIGS. 13 and 14 additionally illustrate, via axonometric sketches 1300 and 1400, scenarios similar to the one of FIG. 2A with and without additional molded layer 105, respectively.

The connector 110 may again include one or more further elements such as housing 110B. The contact elements 118 may have been secured to the substrate film 102 utilizing e.g. adhesive such as non-conductive or conductive adhesive. Alternatively or additionally, the contact elements 118 may include securing or locking members such as crimping spikes or similar protrusions, extensions or generally features in case the contact elements 118, or the connector 110 in general, are of crimped type. The spikes/features may penetrate into and potentially through the film 102 and/or elements such as circuit design/contact area thereon. Accordingly, the spikes may enhance or secure electrical contact of the contact elements 118 (via the spikes and/or via the opposing side of the contact elements 118 wherefrom the spikes extend) to the circuit design on the film 102 in addition to enhancing mechanical fastening of the contact elements 118 to the film 102 and multilayer structure in general. Through spikes or other features, a contact element 118 essentially provided on one side of the film 102, may connect to the opposing side of the film 102 and e.g. circuit design thereon.

The connector 110 may include a housing that is a pre-manufactured element at least partially manufactured from plastics overmolded on the film 102 as contemplated also herein elsewhere.

In the embodiment 240 of FIG. 2B, the contact elements 118 still have bent or angled portions, which thus enables lateral coupling to the substrate film 102 and e.g. circuit design (contact areas 107) thereon, while the remote ends of the contact element 118 extend transversely away from the film 102.

In contrast to the scenario of FIG. 2A, here the contact elements 118 are essentially positioned and remain (notwithstanding possible presence of e.g. crimping spikes that could in some embodiments extend to the opposite, "top" side of the film 102) on the same, single side ("exit" side, i.e. bottom side in the figure) of the film 102 instead of being directed around it, or at least to a greater extent through it, from a side 102A, 102B to another.

Figure 2C:
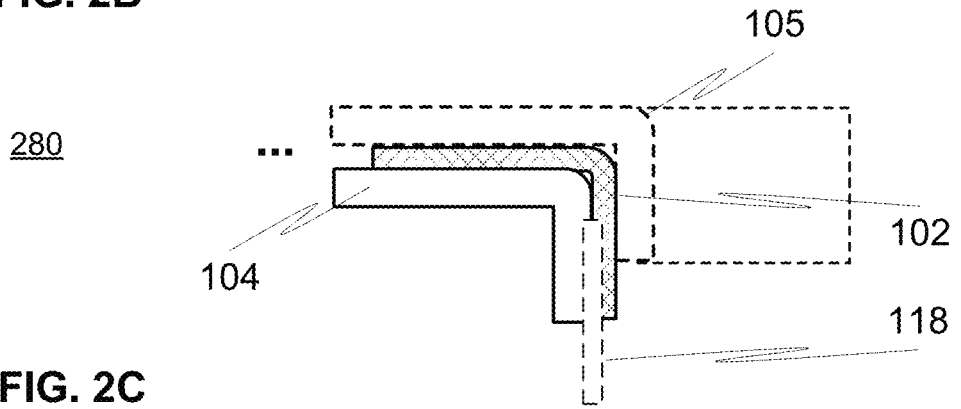
FIG. 2C depicts still a further cross-sectional side view of an embodiment of the multilayer structure in accordance with the present invention.

FIG. 2C illustrates, at 280, a further embodiment, wherein in contrast to the previous two embodiments, the substrate film 102 itself includes a bent (curved) portion at its end where also the connector with contact elements 118 is substantially located. The substrate film 102 may thus define a lip, flange or a similar protrusion that extends from the remaining structure to selected direction. Orientation and dimensions of the concerned extension may naturally differ from the illustrated ones depending on the needs of each use scenario (e.g. shape and size of the external connecting element, host device or host structure, etc.). Nevertheless, the resulting 3D shape of the film 102 may have been at least partially obtained through 3D forming (shaping) of the film by thermoforming, for example. Alternatively, the film 102 may have been directly manufactured from a used raw material to the intended 3D shape including the bent through molding among other options.

As indicated by broken lines, also in this embodiment as well as in other embodiments including the embodiments of FIGS. 2A and 2B, the edge of the substrate film 102 may but does not have to substantially correspond to the edge of the overall multilayer structure and e.g. of molded layers 104, 105, i.e. the remaining structure may extend beyond the film 102 or the edge of the film 102 in a selected direction (laterally by layer 105 in the scenario of FIG. 2C) so that the edge of the substrate film 102 and related connector with contact elements 118 protrudes away from the remaining structure at the more central portion thereof.

Figure 3:
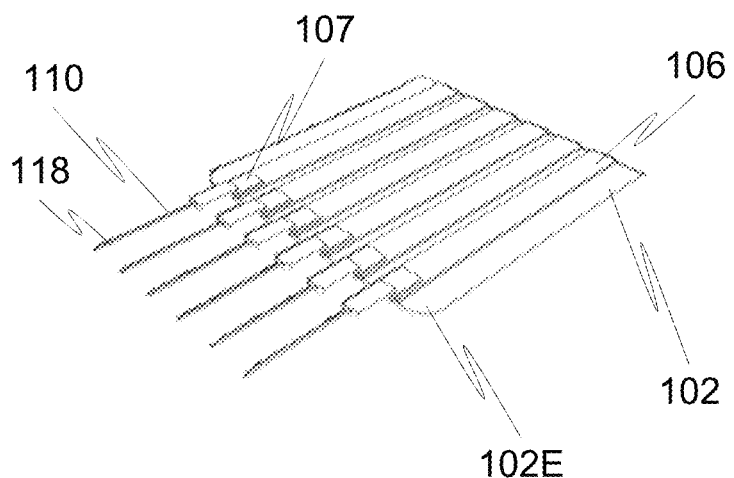
FIG. 3 illustrates an embodiment of the connector, particularly its contact members, in terms of structure and connection to the circuit design on the substrate film.

FIG. 3 illustrates, at 300, an embodiment of the connector 110, particularly contact members 118, in terms of both structure and connection to the circuit design that comprises conductive elements 106 on the substrate film 102, 103. Overmolded plastics layer(s) 104, 105, optional connector housing 110B and potential other elements of the overall multilayer structure are not illustrated in the figure for clarity reasons.

In this and various other embodiments, the circuit design provided in the multilayer structure generally includes contact areas 107, which may be just selected portions of the overall circuit, e.g. of traces, without any particular further difference to other circuit elements such as traces in terms of e.g. materials and/or dimensions, or the contact areas 107 may contain e.g. one or more materials or material combinations different from one or more other areas of the circuit design. For example, the material(s) of the contact areas 107 may be made particularly conductive and/or any of the concerned conductive material(s) may also be of adhesive type in contrast to e.g. a conductive trace or feature elsewhere in the design 106.

The contact elements 118 illustrated are distinctly elongated, e.g. pin, rod, spike or needle-like, elements that extend laterally from the substrate film 102. In some embodiments, e.g. pin connectors or at least related pins could be utilized in constructing the connector 110 and overall multilayer structure of the present invention. The contact elements 118 may be of crimped (with spikes) or non-crimped (secured using adhesive, for example) type.

Figure 4:
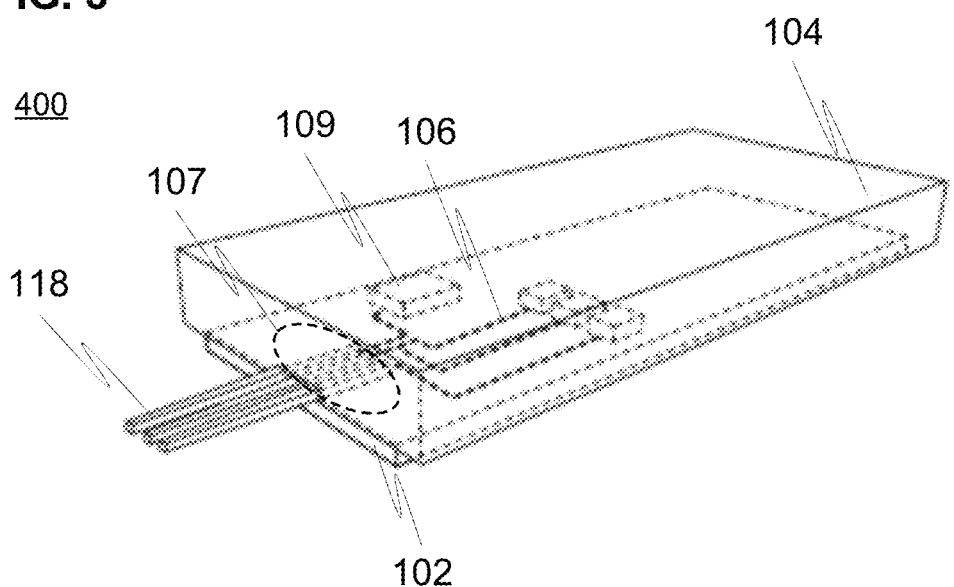
FIG. 4 is an axonometric illustration of an embodiment of the multilayer structure in accordance with the present invention, incorporating e.g., contact elements similar to the ones in FIG. 3.

FIG. 4 illustrates, at 400, an axonometric illustration of an embodiment of the multilayer structure in accordance with the present invention, incorporating e.g. the connector and/or contact elements similar to the ones as shown FIG. 3.

A plastic layer 104 has been produced here by molding on the substrate film 102 so that at least the connection points (area or region of the joint) between the contact areas 107 and contact elements 118 are covered and thereby protected and also additionally secured. Yet, at least part of the circuit design comprising e.g. conductive elements 106 such as traces (wiring) and e.g. associated electronic components 109 are at least partially embedded in the plastics. The ends of the contact elements 118 remain accessible from outside the structure 300, i.e. they stick out from the structure or at least from the molded plastics 104 for connection with the external connecting element 112.

Figure 5A:
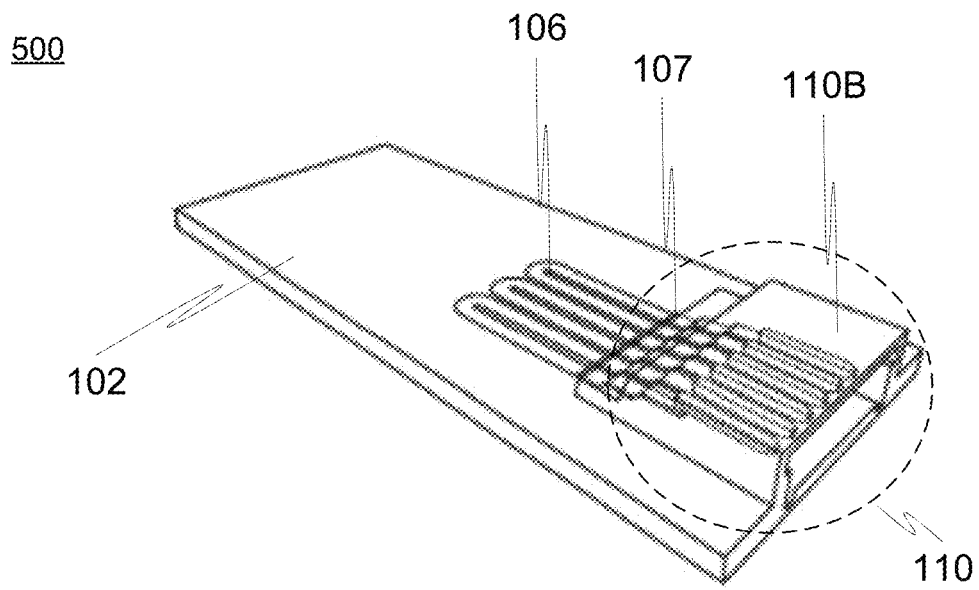
FIG. 5A illustrates an embodiment of the multilayer structure in its final or interim stage.

FIG. 5A illustrates, at 500, an embodiment of the multilayer structure. In the shown case the connector 110 is, in accordance with the principles of the present invention, at the edge of the substrate film 102. A connector housing 110B defining e.g. a receptacle may be included in the connector 110 and established from pre-prepared element(s) and/or through in situ molding on the film 102 as discussed herein.

Figure 5B:
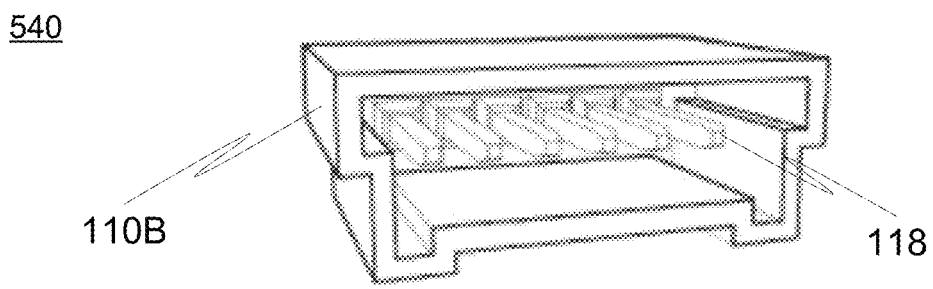
FIG. 5B illustrates a connector insert that could be utilized in connection with the embodiments of the present invention, such as in the embodiment of FIG. 5A.

FIG. 5B illustrates, at 540, an embodiment of a connector insert (pre-manufactured piece utilized as an insert in injection molding or generally overmolding procedure of the substrate film 102) that may be utilized in connection with the embodiments of the present invention, such as in the embodiment of FIG. 5A, to provide at least part of the connector housing 110B. Roughly similar shapes as provided by the pre-manufactured (e.g. pre-molded) insert could be alternatively obtained by molding plastic material upon the film 102 to establish at least portion of the housing 110B in situ (on the film 102 from a selected (plastic) source material). The insert may be secured e.g., by adhesive or essentially mechanical locking members as discussed hereinbefore to the film 102.

Figure 5C:
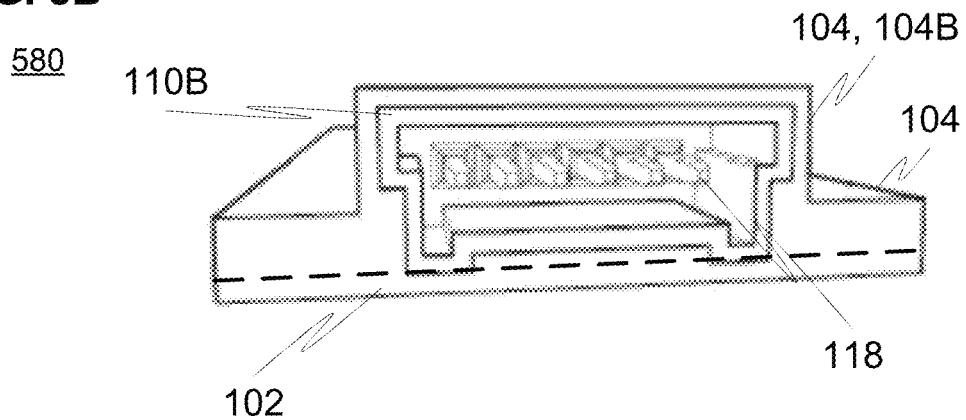
FIG. 5C is a side view of the insert of FIG. 5B when overmolded by plastic material.

FIG. 5C illustrates, at 580, a side view of an embodiment of the insert type of a connector housing of FIG. 5B when overmolded by plastic material. The molded plastic layer 104 at least partially covers and embeds the housing 110B as well as the connection points between the contact elements 118 and the circuit design on the substrate film 102. However, the layer 104 preferably still leaves at least the necessary portion(s) including the ends of the contact elements 118 (farthest from the film 102) and e.g., potential receptacle shape defined by the housing 110B, exposed for coupling with a matching (compatible) external connecting element such as a plug type connector.

Figure 6A:
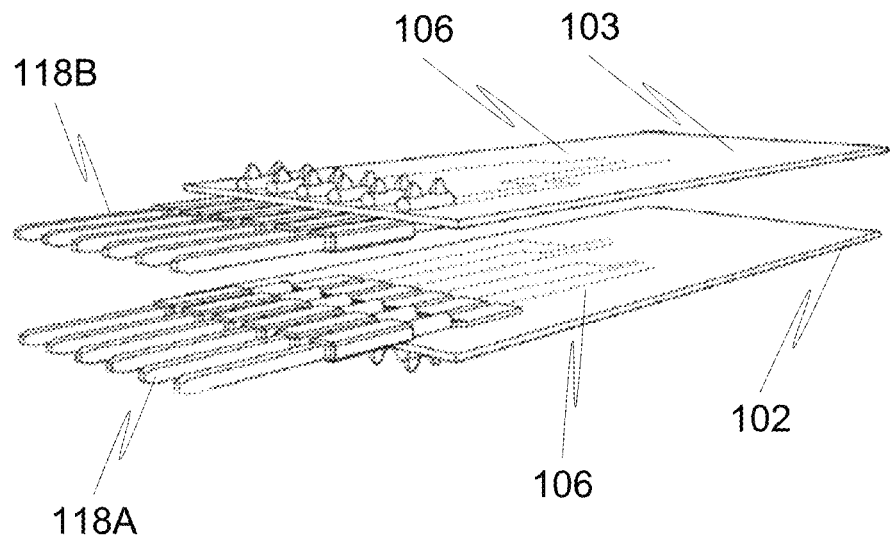
FIG. 6A illustrates two substrate films provided with circuit designs and contact elements for use in various embodiments of the present invention.

FIG. 6A illustrates, at 600, two substrate films 102, 103 both provided with circuit designs comprising conductive elements 106 (may be mutually more or less similar) and respective contact elements 118A, 118B assigned to the films for use in various embodiments of the present invention. Although in the visualized scenario, each film 102, 103 comprises a mutually same or similar number of mutually similar contact elements 118, 118A, 118B thereat, in other embodiments the type and/or number of contact elements 118 provided to each film 102, 103 of the multilayer structure may mutually vary. The films 102, 103, associated circuit designs and/or related contact elements 118A, 118B may be aligned in a selected stacked or overlapping fashion, such as superimposed or superposed.

Figure 6B:
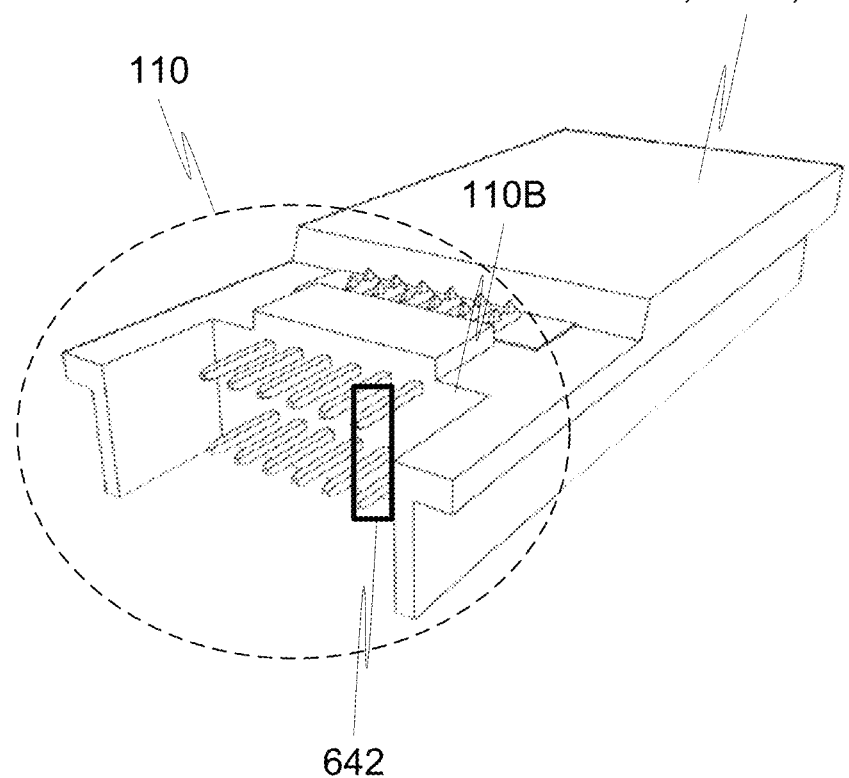
FIG. 6B illustrates an embodiment of providing several adjacent or stacked rows of contact elements in an embodiment of the multilayer structure of the present invention for connecting several layers of electronics, such as the circuit designs of FIG. 6A, together and/or to the external device, element or system.

Accordingly, FIG. 6B illustrates, at 640, provision of several adjacent or stacked contact elements or essentially rows of contact elements, such as metal pins or terminals, in an embodiment of the multilayer structure of the present invention for connecting several layers of electronics, such as the circuit designs of FIG. 6A, included in the multilayer structure either together and/or to external device, element or system. As a result, film-to-film and circuit-design-to-circuit-design connections may be established, for instance.

Multiple mutually aligned, e.g. essentially parallel in terms of at least some of the included contact elements 118 or their portions such as end portions, connectors 110 such as row connectors may be thus produced in a common multilayer structure. Yet, a common or joint connector 110 such as a multi-row connector (in the shown case, essentially a double-row connector), spatially thus bringing together or at least exposing contact elements 118 from different layers (118A, 118B), which is highlighted by a broken line around end portion of the illustrated multilayer structure may be constructed. It may contain a housing 110B of insert and/or in situ-prepared type as discussed hereinbefore, for example. A number of molded plastic layer(s) 104, 104B, 105 of mutually similar or different materials (that may in turn be the same material or different material used for preparing the housing 110B) have been provided on the underlying substrate films 102, 103, preferably at least between the films 102, 103 and optionally on any of the opposite, exterior (from the structure's view) side(s) thereof.

As sketched in the figure, an optionally removable and e.g. re-usable external connecting element 642, such as a so-called jumper, may be configured either during the manufacture of the structure or afterwards, e.g. during subsequent use, to the connector 110 to electrically connect and optionally essentially short circuit two or more of the contact elements 118 together, e.g. at least one contact element 108A, 108B from different films 102, 10 or other layers present in the structure. By the connecting element 642, circuit designs on multiple films 102, 103 of the structure may be electrically connected.

Figure 7A:
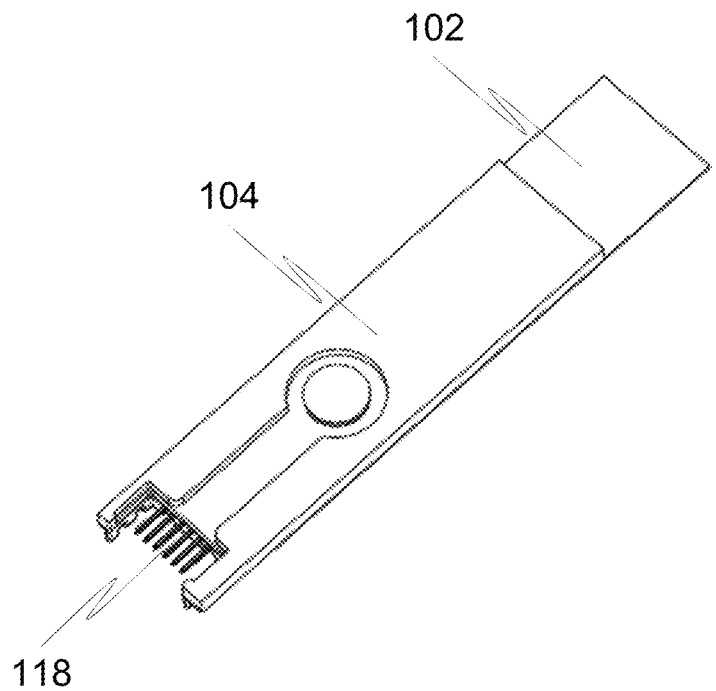
FIGS. 7A and 7B illustrate an embodiment of the multilayer structure manufactured preferably through utilization of multi-shot molding.
Figure 7B:
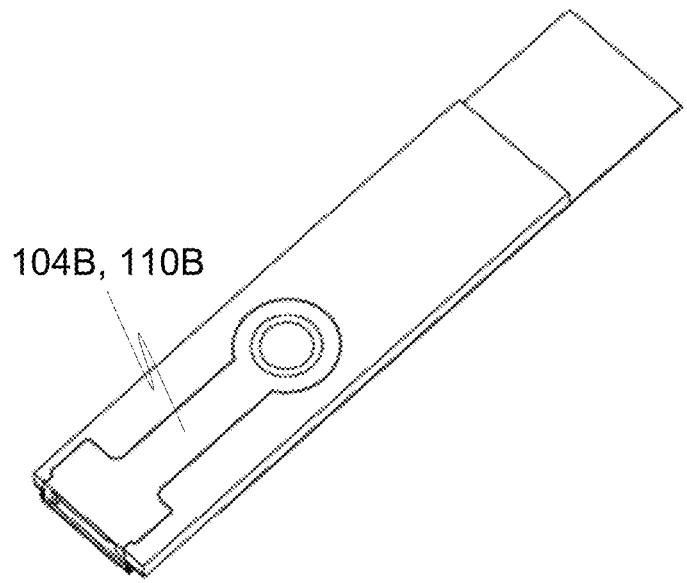

FIGS. 7A and 7B illustrate, at 700 and 740, respectively an embodiment of the multilayer structure manufactured preferably through utilization of multi-shot molding. On a substrate film 102, a circuit design has been provided as well as a number of contact elements 118 connecting to the circuit design via associated connection points. The film 102 including the connection points has been overmolded by plastic layer 104 using at least a single molding shot. Yet, at least one further shot of optionally different material has been applied to produce at least one more covering plastic layer 104B and/or at least portion of the connector housing 110B. Still, as in other preferred embodiments, the contact elements 118 remain externally accessible.

Figure 9:
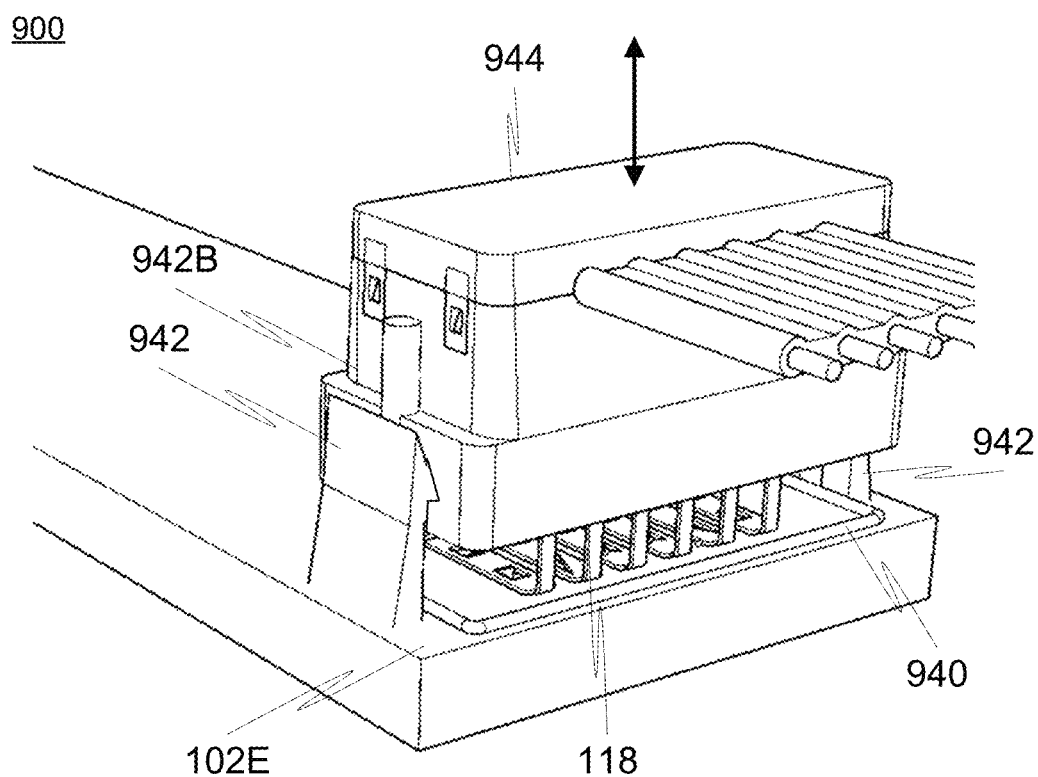
FIG. 9 illustrates an embodiment incorporating a multi-part connector.

FIG. 9 illustrates, at 900, an embodiment incorporating a multi-part connector. The connector 900 may include a portion including, for example, a number of contact elements 118, which has been initially provided and preferably secured to the substrate film 102 or an element or a layer such as a molded plastic layer thereon. Preferably, the portion has been overmolded by plastics at least having regard to connection points between the contact elements 118 and respective contact areas of the circuit design.

A further portion 944 of the connector, which may have been fabricated as a pre-manufactured piece or an aggregate piece of smaller components (e.g. housing hosting a number of conductive elements such as contact elements or their portions), may have been then brought into contact with and secured to the existing portion on the film 102 by adhesive, overmolded plastics, and/or locking members 942 (e.g. an optionally elastic protrusion such as a barbed protrusion potentially established from molded plastics), 942B (a compatible, matching feature or shape such as a recess, bevel or edge) provided in any portion of the connector and/or in the structure elsewhere. In some embodiments, the subsequently connected attachable portion 944 could be removably attachable and optionally also remain removably attached in the multilayer structure (see the bidirectional arrow illustrating this option in the figure) whereas in some embodiments, it could be more permanently attached using e.g. adhesive or overmolding for the securement, or more permanently interlocking locking members. Removability would facilitate dynamically updating the connectivity of the structure based on the nature of external connecting elements, for instance, or replacing a damaged part, among other potential benefits.

Yet, at least one sealing member 940, optionally a gasket of e.g. rubbery and/or compressive material, such as elastomer, may have been provided, e.g. on an area of the substrate film 102E or on the at least one molded layer, or specifically, on a portion of the connector itself.

Instead of or in addition to utilizing one or more sealing members 940 to seal portions of the connector together, or the connector or its portion e.g., onto the substrate film 102 and/or onto a molded plastic layer, at least one sealing member could be configured so as to contact the external connecting member when installed. An example of such situation could be considered also based on the scenario shown in in FIG. 9, if item 944 is alternatively considered to represent the external connecting element (connector) and the locking member 942 secures, optionally removably (by surpassing the elastic force or spring force introduced by the locking member 942, for example) its attachment to the connector of the multilayer structure including contact elements 118.

Preferably, the sealing member 940 provides at least a desired level of dust protection if not a hermetic seal between the connected elements.

Figure 10:
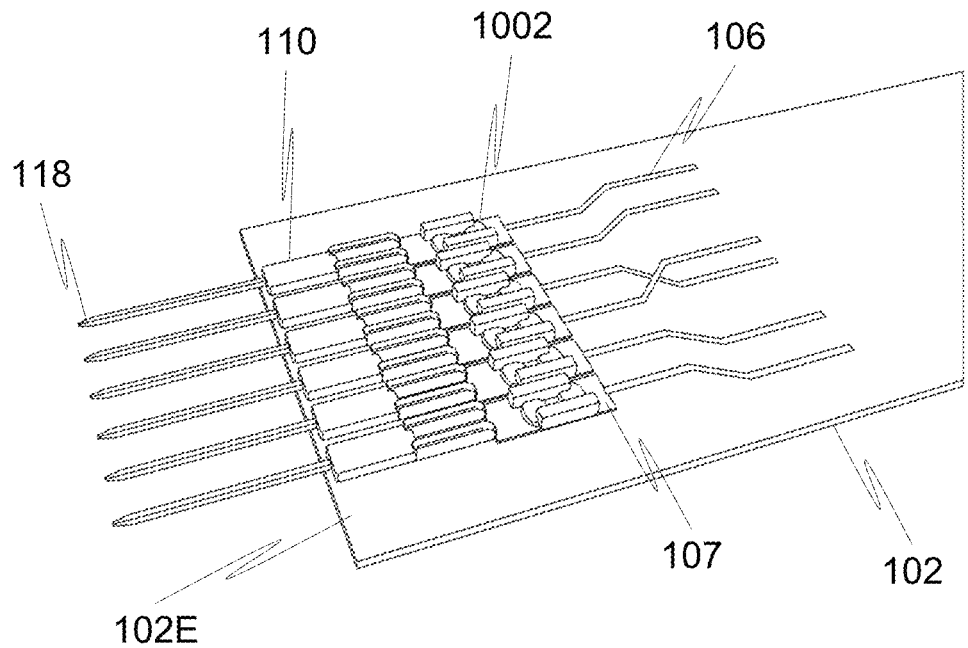
FIG. 10 illustrates an embodiment of utilizing compressive material between the contact elements and the circuit design.
Figure 11:
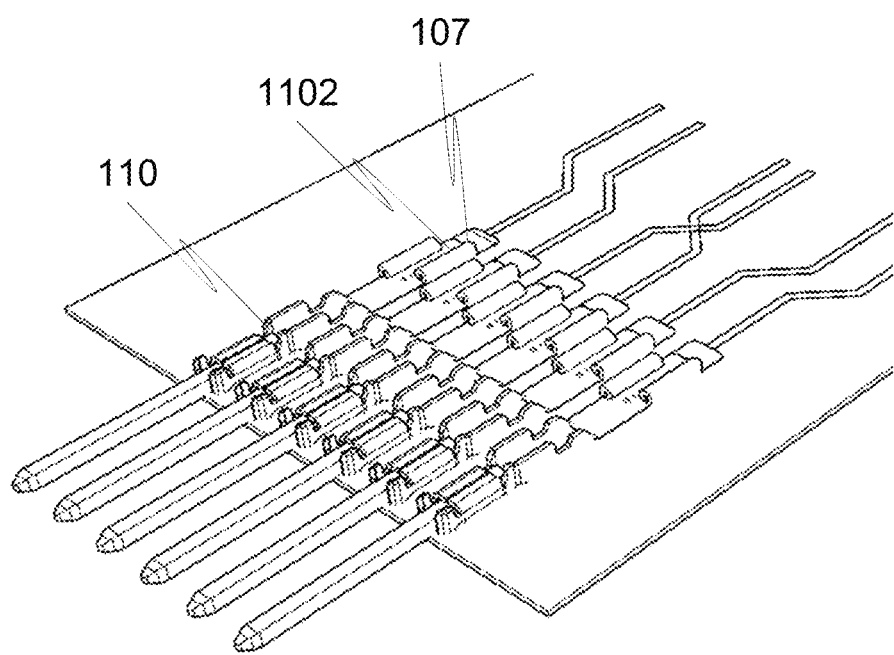
FIG. 11 illustrates one other embodiment of exploiting compressive material.

FIGS. 10 and 11 illustrate, at 1000 and 1100, respective two embodiments of exploiting compressive material 1002, 1102 between the contact elements 118 and the circuit design comprising conductive elements 106 defining also contact areas 107 for the contact elements 118 of the connectors 110.

In the depicted scenarios, the contact elements are of crimped type. When crimp spikes or similar protrusions are subjected to varying conditions in terms of e.g. heat and pressure, which may take place in the context of the present invention during overmolding such as injection molding, they may be prone to breakage or detachment, whereupon having compressive material configured between them and the contact areas 107, or the substrate film 102 in general, is considered beneficial in terms of preserving the established electrical contact and the associated elements. Naturally the provision of compressive material 1002, 1102 may be preferred also in connection with different type of contact elements 118.

In FIG. 10, the instances of compressive material 1002, 1102 have been configured as more local dots or deposits at the connection points between the contacts 118 and the contact areas 107 whereas in FIG. 11, they are larger slip or sheet-like elements or layers extending parallel to the contact elements 118 over a larger area. The compressive material 1002, 1102 may be provided by installing ready-made elements at the connection points or directly producing the instances from source materials using a suitable coating, deposition, spraying, or other method.

Preferably, the compressive material 1002, 1102 is electrically conductive, e.g. conductive rubber (or generally elastomer), rubbery or other suitable composite material. Yet, it may be penetrable and eventually penetrated by the contact elements 118 such as crimping spikes upon their installation.

Figure 12:
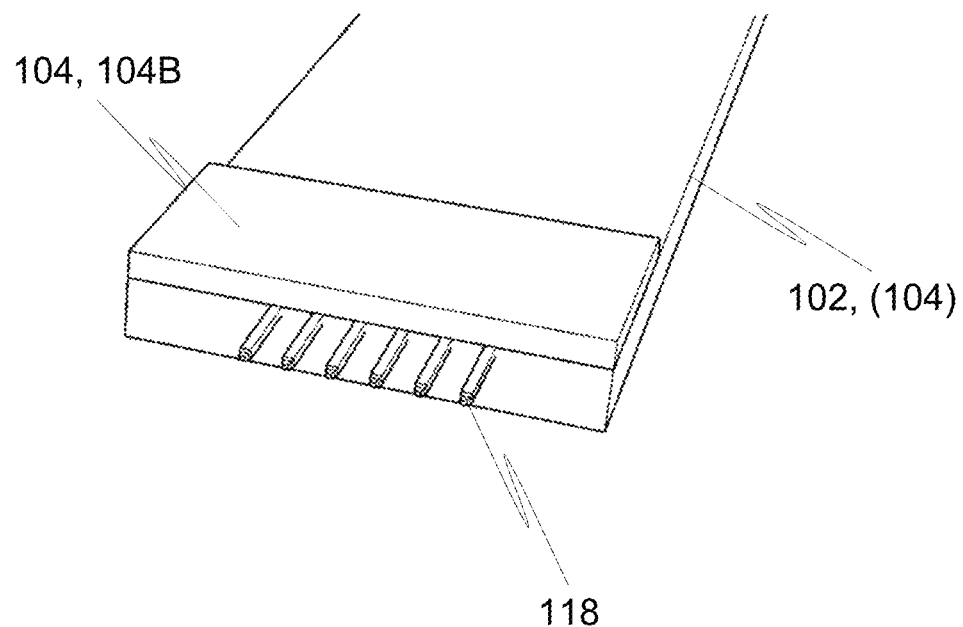
FIG. 12 illustrates a further embodiment of a multilayer structure (or related work product) in accordance with the present invention.

FIG. 12 illustrates, at 1200, a further embodiment of a multilayer structure (or related work product) in accordance with the present invention. For example, the connector structures depicted in FIGS. 10 and 11, and obviously many others, could be included in the shown kind of a multilayer structure by selectively overmolding them by one or more plastic layers 104, 104B as discussed herein elsewhere. In the illustrated example, at least the topmost molded layer 104, 104B is provided only at the connector end of the structure and is thus spatially limited. There may still be e.g. underlying one or more molded layers (item 104 placed in parenthesis in connection with the substrate film 102 highlighting this option) in the structure that cover larger and/or other areas of the substrate film 102. Accordingly, the multilayer structure 1200 may have a gradually or more step-wise changing overall thickness. In the scenario of FIG. 12, the connector end or region is thicker than the neighbouring areas.

Figure 8:
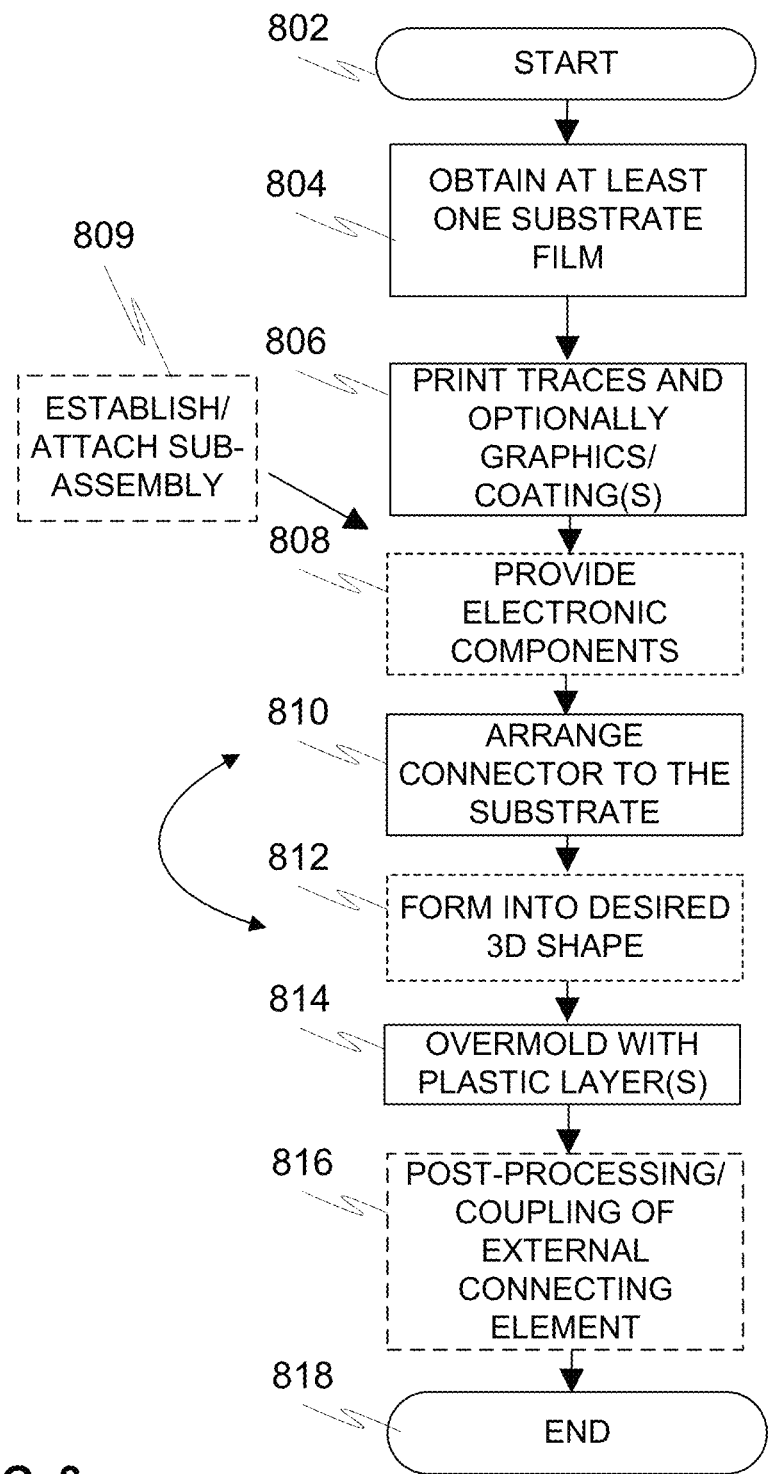
FIG. 8 is a flow diagram of a method in accordance with an embodiment of the present invention.

FIG. 8 includes, at 800, a flow diagram of an embodiment of a method in accordance with the present invention.

At the beginning of the method for manufacturing the multilayer structure, a start-up phase 802 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cutting, drilling and/or printing equipment, among others, may be thus ramped up to operational status at this stage.

At 804, at least one, optionally flexible, substrate film of plastics or other material for accommodating electronics is obtained. The substrate film may initially be substantially planar or e.g. curved. A ready-made element, e.g. a roll or sheet of plastic film, may be acquired for use as the substrate material. In some embodiments the substrate film itself may be first produced in-house by molding or other methods from selected starting material(s). Optionally, the substrate film may be processed further at this stage. It may be, for example, provided with holes, notches, recesses, cuts, etc.

At 806, a number of conductive elements defining e.g. conductor lines (traces) and/or contact areas to construct a circuit design are provided on the substrate film(s), either or both sides thereof, preferably by one or more additive techniques of printed electronics technology. For example, screen, inkjet, flexographic, gravure or offset lithographic printing may be utilized. In some cases, also subtractive or semi-additive processes may be utilized. Further actions cultivating the film(s) involving e.g. printing or generally provision of graphics, visual indicators, optical elements, etc. thereon may take place here.

At 808 (optional), one or more typically ready-made components including electronic components such as various SMDs may be attached to the contact areas on the film(s) e.g. by solder and/or adhesives. Alternatively or additionally, printed electronics technology may be applied to actually manufacture at least part of the components, such as OLEDs, directly onto the film(s). Accordingly, the execution of items 1806, 1808 may temporally overlap as being understood by a skilled person.

Item 810 refers to arranging at least portion of at least one connector at the edge of the substrate. The connector and/or its components such as housing and/or contact elements may be provided to the substrate utilizing any feasible positioning or installation technique such as standard pick and place method/equipment (when applicable). Applicable bonding (using e.g. adhesive or other bonding substance), gluing, and/or further securing techniques involving e.g. the use of locking members may be additionally utilized. For example, one or more contact elements may be crimped to the substrate. As discussed hereinbefore, in some embodiments at least portion of e.g. connector housing may be manufactured in situ preferably from plastics molded onto the substrate, which is discussed in more detail with reference to item 814.

In some embodiments, at least one sealing member may be provided e.g. at this stage, if not earlier or later, as a ready-made element (e.g. rubbery ring or gasket), which may be additionally secured to a host surface (substrate, connector, molded plastic layer, etc.) mechanically or chemically (e.g. by adhesive) or produced directly e.g. as a material layer from source material utilizing a suitable production technology such as spraying, printing (e.g. jetting), or deposition. The host surface may contain or be provided with a receiving surface structure such as a ridge and/or a recess for the sealing element.

In some embodiments, a number of through-holes or at least thinned portion(s) may be first arranged in a hosting substrate film so that a portion of the connector such as part of the housing and/or electrical contact elements, e.g. pins, thereof may be directed through them to establish a contact with the circuit design. In some embodiments, in addition to or instead of using pre-prepared hole(s), the necessary hole(s) may be dynamically established upon piercing the substrate by e.g. contact elements of the connector responsive to the aforesaid crimping or other suitable method. The connector may be configured to contact the circuit design(s) on either or both sides of the substrate film.

The procedure may further involve bending e.g. the ends or central portions of the contact elements so as to make them extend substantially parallel to the surface of the substrate and e.g. conductive elements/circuit design thereon and/or perpendicular thereto to better interface with an external connecting element, for example, depending on the embodiment.

Yet, in some embodiments as discussed hereinbefore, in addition to or instead of providing the connector or a portion thereof physically through the substrate film, the connector may comprise e.g. two portions or parts (initially separate or integral) on opposing sides of the substrate that are joined together by at least one intermediate feature (e.g. one bridging feature or e.g. two connecting, lateral extensions on each side of the substrate), extending from one side of the substrate to the other side, over the edge thereof. Such arrangement thus enables the connector structure to at least functionally extend through the substrate, if not directly physically through it via e.g. a hole.

Item 809 refers to possible attachment of one or more sub-systems or 'sub-assemblies' that may incorporate an initially separate, secondary substrate provided with electronics such as IC(s) and/or various components. At least part of the electronics of the multilayer structure may be provided to the substrate film(s) via such sub-assembly. Optionally, the sub-assembly may be at least partially overmolded by a protective plastic layer prior to attachment to the main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the primary substrate. Item 1809 could also be executed e.g. upon item 806 or 810. The shown position thereof is primarily exemplary only.

In some embodiments, prior to or upon the molding phase the substrate film(s) preferably already containing e.g. at least part of the circuit design, such as (printed) conductive elements and optionally electronic components, and/or of the connector (see the bi-directional curved arrow highlighting the fact that forming could alternatively or additionally take place e.g. between items 808 and 810, or even prior to item 806 or 808) may be formed 812 using thermoforming or cold forming, for instance, to exhibit a desired shape such as at least locally a three-dimensional (essentially non-planar) shape. The substrate containing suitable formable material may therefore be shaped to better fit the target environment/device and/or to better accommodate features such as the electrical connector (e.g. in a recess). Additionally or alternatively, forming could take place after molding in case the already-established multilayer stack is designed to survive such processing.

At 814, at least one plastic layer, preferably thermoplastic or thermoset layer, is produced, preferably molded such as injection molded, upon either or both sides of the substrate(s) so as to preferably at least partially embed the connector and especially e.g. the connection points of the associated contact elements and the contact areas of the circuit design in the molded material such as selected thermoplastic or thermoset resin. As discussed hereinbefore, the molded material(s) may be provided using several molding steps or shots, or via a single step, wherein molded material may even optionally flow through the film from one side thereof to the opposing side via a hole prepared therein or by penetrating through the substrate material itself (e.g. through a thinned/thinner portion), for example.

In some embodiments, also at least a portion of a connector housing may be produced by molding, optionally injection molding. It may be molded using the same material and common process step, such as a molding shot, as one or more other features or material layers (e.g. 103, 104) of the multilayer structure, or it may be prepared from other material(s) such as other resin(s) through separate process steps such as molding shot(s).

In practice, at least one substrate film already provided with a number of further features such as a circuit design, various components, a connector or its components, etc. may be used as an insert in an injection molding process. One side of the substrate film may be, in some embodiments, left free from the molded plastics depending on the embodiment.

In case two films are used, both of them may be inserted in their own mold halves so that the plastic layer is injected at least between them. Alternatively, the second film could be attached to an aggregate of the first film and plastic layer afterwards by suitable lamination technique.

In the case of e.g. a multi-part connector, a portion of the connector could be provided to the structure either after molding or between several molding actions, for example, with reference to e.g., the embodiment of FIG. 9.

Regarding the resulting overall thickness of the obtained stacked multilayer structure, it depends e.g. on the used materials and related minimum material thicknesses providing the necessary strength in view of the manufacturing and subsequent use. These aspects have to be considered on case-by-case basis. For example, the overall thickness of the structure could be in the order of magnitude of about 1 mm or a few millimetres, but considerably thicker or thinner embodiments are also feasible. Item 816 refers to possible additional tasks such as post-processing tasks. Further layers may be added into the multilayer structure by molding, lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate or a molded layer thereon depending on the embodiment. Shaping/cutting may take place. The connector may be connected to a desired external connecting element such as am external connector of an external device, system or structure. For example, these two connectors may together form a plug-and-socket type connection and interface.

Following connecting of the external connecting element to the connector element of the multilayer structure, the established connection and related elements may be further secured and/or protected by additional processing, such as low pressure molding of plastics or resin dispensing (epoxy), whereupon the resulting layer may at least partially encapsulate desired elements in the connection region, for example. Low pressure molding or resin dispensing may be exploited to protect and/or secure also other elements, such as electrical elements, of the structure.

At 818, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, in some scenarios instead of molding, the plastic or other layer of similar function could be produced on the substrate using a suitable deposition or a further alternative method. Yet, instead of printed traces, the traces could be produced/provided otherwise. E.g. a conductor film manufactured utilizing etching, among other options, could be applied.

The invention claimed is:

1. An integrated multilayer structure comprising:
  a substrate film having an outer surface that extends to an outermost edge, the substrate film comprising an electrically substantially insulating material;
  a circuit design comprising electrically conductive elements, provided on the substrate film, said conductive elements defining a number of contact areas;
  a connector supported on the outer surface of the substrate film and extending to the at an outermost edge of the substrate film, the connector comprising a number of electrically conductive elongated contact elements connected to the contact areas of the conductive elements of the circuit design on the substrate film while further extending away from the contact areas substantially along the outer surface of the substrate film over the outermost edge of and from the substrate film to free ends thereof that selectively couple to an external connecting element responsive to mating the external connecting element with the connector, the connector including an electrically insulating connector housing for the contact elements, the contact elements at least partially positioned in contact with the outermost edge of the substrate film and the outer surface of the substrate film; and
  at least one plastic layer molded onto the substrate film so as to at least partially cover the circuit design and only partially cover the connector, the covered portions including connection points of the contact elements with the contact areas and at least partially excluding the extended portions of the contact elements configured to couple to the external connecting element.

2. The structure of claim 1, wherein said circuit design comprises a number of electronic components.

3. The structure of claim 1, wherein the connector housing comprises or consists of a pre-prepared separate piece of material, said connector housing being at least partially overmolded by one or more layers of the at least one plastic layer.

4. The structure of claim 1, wherein the connector housing is at least partially defined by a plastic layer of the at least one plastic layer molded onto the substrate film, comprising a different material than at least one other layer of the at least one plastic layer, said housing-establishing plastic layer being at least partially overmolded by at least one further plastic layer of the at least one plastic layer.

5. The structure of claim 1, wherein the at least one plastic layer comprises at least two adjacent layers of mutually different material.

6. The structure of claim 1, wherein the at least one plastic layer comprises a functional layer with thermally conductive and/or optically transmissive or opaque material, said functional layer establishing at least portion of connector housing and/or embedding one or more electronic components included in the circuit design.

7. The structure of claim 1, wherein the edge of the substrate film is bent or angled, said substrate film substantially defining an L-profile.

8. The structure of claim 1, wherein the at least one plastic layer partially covering the connector, including the connection points, is located on one side of the substrate film, and the remote ends of the extended portions of the contact elements to contact the external connecting element are located on the same or opposite side of the substrate film.

9. The structure of claim 1, wherein the contact elements of the connector extend laterally beyond the edge of the substrate film, thereby substantially defining an I-profile, and/or transversely away from the substrate film, thereby substantially defining an L-profile.

10. The structure of claim 1, wherein one or more of the contact elements of the connector are bent or angled.

11. The structure of claim 1, wherein at least one element or portion of the connector, comprising at least one contact element and/or connector housing or part thereof, has been secured to any remaining portion of the connector, the at least one plastic layer, the substrate film and/or the contact area thereon through the use of at least one element selected from the group consisting of: adhesive, conductive adhesive, mechanical securement, chemical securement, thermal securement, crimping, friction securement, and compressive force such as spring force based securement.

12. The structure of claim 1, wherein the connector is configured to provide galvanic electrical connectivity for signal and/or power transfer and a further connectivity, including optical and/or thermal connectivity, thereby rendering the connector a hybrid connector.

13. The structure of claim 1, wherein said connector comprises at least one feature selected from the group consisting of: pin header, crimped connector, crimped contact element, crimping spike, springy contact element, row connector, spring-loaded contact element, spring-loaded contact pin or slip, contact pad, contact area, contact pin, crimped contact pin, hole with walls and/or bottom of conductive material, socket, female socket, male plug or socket, hybrid socket, pin socket, and spring pin socket.

14. The structure of claim 1, wherein the contact elements of the connector protrude away from the inner, optionally substantially middle, or peripheral area of the outer surface of the structure.

15. The structure of claim 1, further comprising compressive material between at least a portion of at least one contact element of the connector and the substrate film.

16. The structure of claim 1, further comprising a sealing member, configured on the substrate film, the at least one plastic layer or specifically, on at least a portion of the connector provided on the substrate film, so as to face and contact the external connecting member or a further portion of the connector implementing a hermetic seal between the connected elements.

17. The structure of claim 1, further comprising a locking member for removably securing a portion of the connector or the external connecting member to the structure.

18. The structure of claim 1, wherein the electrically conductive elongated contact elements include pins.

19. The structure of claim 1, wherein the outermost edge is a side edge that extends between a top surface and a bottom surface of the substrate film.

20. The structure of claim 1, wherein the electrically conductive elongated contact elements are in contact with the surface and the outermost edge of the substrate film along which the electrically conductive elongated contact elements extend.

21. An integrated multilayer structure comprising:
a substrate film comprising an electrically substantially insulating material;
a circuit design comprising electrically conductive elements, provided on the substrate film, said conductive elements defining a number of contact areas;
a connector at an outermost edge of the substrate film, the connector comprising a number of electrically conductive elongated contact elements connected to the contact areas of the conductive elements of the circuit design on the substrate film while further extending from the substrate film to couple to an external connecting element responsive to mating the external connecting element with the connector, the connector including an electrically insulating connector housing for the contact elements, the contact elements at least partially positioned in contact with the outermost edge of the substrate film;
at least one plastic layer molded onto the substrate film so as to at least partially cover the circuit design and only partially cover the connector, the covered portions including connection points of the contact elements with the contact areas and at least partially excluding the extended portions of the contact elements configured to couple to the external connecting element; and
a further substrate film having a further circuit design with electrically conductive elements thereon, wherein plastic material of one or more plastic layers of the at least one plastic layer is located between the substrate films, the circuit designs of the substrate films being electrically connected by the connector and/or a connecting member.

22. The structure of claim 21, wherein said number of contact elements of the connector comprises a first contact element and the connector further comprises a second contact element that is connected to the further circuit design of the further substrate film, the remote ends of said first and second contact elements extending from the respective substrate films being located adjacent each other.

23. The structure of claim 22, wherein the first and second contact elements are connected together, utilizing a removably attachable connecting element, such as an externally disposable jumper or other externally disposable connecting element.

24. A method for manufacturing a multilayer structure, comprising:
obtaining a substrate film having an outer surface that extends to an outermost edge, the substrate film comprising an electrically substantially insulating material for accommodating electronics;
providing, at least in part by printed electronics technology, a circuit design comprising electrically conductive elements, including traces, of electrically conductive material on the substrate film, said conductive elements defining a number of contact areas;
arranging at least one connector on the outer surface of the substrate film so that the at least one connector extends from the outer surface to the outermost edge of the substrate film, the connector comprising a number of electrically conductive elongated, substantially rigid, contact elements connected to the contact areas of the conductive elements of the circuit design while being further configured to extend away from the contact areas substantially along the outer surface of the substrate film over the outermost edge of and from the substrate film to free ends thereof that selectively couple to an external connecting element responsive to mating the external connecting element with the connector, the at least one connector including an electrically insulating connector housing for the contact elements;
at least partially positioning the contact elements in contact with the outermost edge of the substrate film and the outer surface of the substrate film; and
molding, utilizing injection molding, thermoplastic or thermoset material on the substrate film so as to at least partially cover the circuit design and only partially the connector, the covered portions including connection points of the contact elements with the contact areas and at least partially omitting the extended portions of the contact elements configured to couple to the external connecting element.

25. The method of claim 24, comprising further securing the electrical connector, by bonding, such as crimping, or using adhesive, on the substrate film.

26. The method of claim 24, comprising forming, thermoforming or cold forming, the substrate film already provided with at least part of the circuit design and with at least part of the connector to shape the substrate film so as to at least locally exhibit a substantially three-dimensional target shape.

27. The method of claim 24, wherein at least portion of a housing of the connector is provided as a ready-made element on the substrate film, included in an insert for said molding.

28. The method of claim 24, wherein at least portion of a housing of the connector is established from the molded material.

29. The method of claim 24, wherein said molding comprises multi-shot molding, wherein at least one shot is utilized to establish at least a portion of a housing of the connector from a different material than the material used for at least one other molding shot.

30. The method of claim 24, comprising providing a sealing member to seal the internals of the external connecting member or a portion of the connector with the rest of the multilayer structure.

31. A method for manufacturing a multilayer structure, comprising:
  obtaining a substrate film comprising an electrically substantially insulating material for accommodating electronics;
  providing, at least in part by printed electronics technology, a circuit design comprising electrically conductive elements, including traces, of electrically conductive material on the substrate film, said conductive elements defining a number of contact areas;
  arranging at least one connector at the outermost edge of the substrate film, the connector comprising a number of electrically conductive elongated, substantially rigid, contact elements connected to the contact areas of the conductive elements of the circuit design while being further configured to extend from the substrate film to couple to an external connecting element responsive to mating the external connecting element with the connector, the at least one connector including an electrically insulating connector housing for the contact elements; at least partially positioning, the contact elements in contact with the outermost edge of the substrate film; and
  molding, utilizing injection molding, thermoplastic or thermoset material on the substrate film so as to at least partially cover the circuit design and only partially the connector, the covered portions including connection points of the contact elements with the contact areas and at least partially omitting the extended portions of the contact elements configured to couple to the external connecting element; and
  a further substrate film comprising electrically substantially insulating material for accommodating electronics is obtained and provided with a further circuit design comprising electrically conductive elements, said conductive elements defining a number of contact areas on the further substrate film;
  wherein said number of contact elements of the connector comprises a first contact element and the connector additionally comprises a second contact element that is connected to a contact area of said number of contact areas on the further substrate film, the remote ends of said first and second contact elements being configured to extend from the respective substrate films and directed adjacent each other.

32. The method of claim 31, wherein the first and second contact elements are connected together, utilizing a removable external connecting element, such as an externally disposable jumper or other externally disposable connecting element.

* * * * *